US012766555B2

(12) United States Patent
Takasugi

(10) Patent No.: US 12,766,555 B2
(45) Date of Patent: Oct. 20, 2026

(54) ULTRASONIC TRANSDUCER AND METHOD FOR MANUFACTURING THE SAME

(71) Applicant: Suncall Corporation, Kyoto (JP)

(72) Inventor: Satoru Takasugi, Kyoto (JP)

(73) Assignee: Suncall Corporation, Kyoto (JP)

( * ) Notice: Subject to any disclaimer, the term of this patent is extended or adjusted under 35 U.S.C. 154(b) by 685 days.

(21) Appl. No.: 18/274,938

(22) PCT Filed: Feb. 3, 2021

(86) PCT No.: PCT/JP2021/003816
§ 371 (c)(1),
(2) Date: Jul. 28, 2023

(87) PCT Pub. No.: WO2022/168188
PCT Pub. Date: Aug. 11, 2022

(65) Prior Publication Data

US 2024/0082877 A1 Mar. 14, 2024

(51) Int. Cl.
*B06B 1/00* (2006.01)
*B06B 1/06* (2006.01)
(Continued)

(52) U.S. Cl.
CPC ........... *B06B 1/0629* (2013.01); *H10N 30/03* (2023.02); *H10N 30/063* (2023.02);
(Continued)

(58) Field of Classification Search
CPC .... B06B 1/0629; H10N 30/03; H10N 30/063; H10N 30/875; H10N 30/883; H10N 39/00; H04R 17/00; H04R 29/00
See application file for complete search history.

(56) References Cited

U.S. PATENT DOCUMENTS 11,413,016 B2 * 8/2022 Suzuki .................... B06B 1/064

FOREIGN PATENT DOCUMENTS

| | | | |
|---|---|---|---|
| JP | 6499097 | B2 | 4/2019 |
| JP | 2020-115940 | A | 8/2020 |
| JP | 6776481 | B1 | 10/2020 |

OTHER PUBLICATIONS

International Search Report issued in Japanese International Application No. PCT/JP2021/003816, mailed Apr. 27, 2021, 5 pages.

* cited by examiner

*Primary Examiner* — Julio C. Gonzalez
(74) *Attorney, Agent, or Firm* — Sterne, Kessler, Goldstein & Fox P.L.L.C.

(57) ABSTRACT

An ultrasonic transducer of this invention includes a supporting plate with concave portions and waveguides opened to first and second surfaces, respectively, a flexible resin film fixed to the supporting plate, and piezoelectric elements fixed to the flexible resin film so that their center regions overlap with the corresponding concave portions and their peripheral regions overlap with the supporting plate in a plan view, a vibrating body formed by the piezoelectric element and the flexible resin film has a resonance frequency of the lowest flexural vibration mode higher than a driving frequency of the piezoelectric element, and the supporting plate is configured so that a resonance frequency of the lowest flexural vibration mode of the entire of the ultrasonic transducer is higher than the driving frequency of the piezoelectric element.

20 Claims, 30 Drawing Sheets

(51) Int. Cl.

| | |
|---|---|
| ***H10N 30/03*** | (2023.01) |
| ***H10N 30/063*** | (2023.01) |
| ***H10N 30/87*** | (2023.01) |
| ***H10N 30/88*** | (2023.01) |
| ***H10N 39/00*** | (2023.01) |

(52) U.S. Cl.
CPC ......... *H10N 30/875* (2023.02); *H10N 30/883* (2023.02); *H10N 39/00* (2023.02)

ULTRASONIC TRANSDUCER AND METHOD FOR MANUFACTURING THE SAME

TECHNICAL FIELD

The present disclosure relates to an ultrasonic transducer in which a plurality of piezoelectric elements is arranged in parallel and which can be suitably used as a phased array sensor and a method for manufacturing the same.

BACKGROUND ART

An ultrasonic transducer in which a plurality of vibration bodies each including a piezoelectric element and a vibrating plate are arranged in parallel can be suitably used as a phased array sensor for detecting the shape of an object or detecting the presence or absence of an object over a wide range. In this case, the following matter has been demanded in the ultrasonic transducer.

Specifically, in order to suppress the generation of a grating lobe phenomenon among ultrasonic waves emitted or radiated by the plurality of vibration bodies, the arrangement pitch of the plurality of vibration bodies needs to be set to ½ or less of the wavelength l of ultrasonic waves emitted from the vibration bodies.

Meanwhile, in order to detect an object in air located ahead by several meters, the frequency of ultrasonic waves emitted from the vibration bodies for use in the ultrasonic transducer needs to be set to a low frequency of about 30 to 40 kHz.

In air at room temperature (20° C.), a wavelength 1 of the ultrasonic wave with a frequency of 40 kHz is 8.6 mm. Therefore, in order to suppress the generation of the grating lobe phenomenon in a state where the vibration bodies are configured to emit the ultrasonic waves having the frequency of 40 kHz, the arrangement pitch of the plurality of vibration bodies needs to be set to 8.6 mm/2=4.3 mm or less.

In addition to this, in order to cause the plurality of vibration bodies to emit ultrasonic waves having respective desired frequencies and phases, it is also needed to prevent the vibration propagation among a plurality of vibration bodies as much as possible.

In this respect, the applicant of the present application filed a patent application regarding an ultrasonic transducer including a rigid elastic plate such as a metal plate and a plurality of piezoelectric elements fixed in parallel on the elastic plate, wherein the elastic plate includes a plurality of vibration regions to which the plurality of piezoelectric elements are respectively attached, a plurality of restriction regions respectively surrounding the plurality of vibration regions via respective low rigidity regions such as a groove, and boundary regions demarcating one restriction region and an outer region located outward in the radial direction relative to the one restriction region, and wherein the boundary region is provided with a slit portion dividing one restriction region from the corresponding outer region and a bridge portion maintaining the mechanical connection between the one restriction region and the corresponding outer region, and the patent application has been patented (see Patent Literature 1 shown below).

The ultrasonic transducer disclosed in the Patent Literature 1 is useful in that vibration propagation from one vibration region to another vibration region can be effectively prevented tanks to the existence of the slit portion while causing the vibration region to have lowered rigidity thanks to the existence of the low rigidity region so that vibration characteristic of the vibration body including the piezoelectric element and the vibration region is improved. However, the ultrasonic transducer still leaves room for improvement in the following point.

Specifically, although the ultrasonic transducer can lower rigidity of the vibration region of the rigid elastic plate by provision of the low rigidity region, it is necessary to expand and contract the piezoelectric element against the rigidity of the vibration region on which the piezoelectric element is mounted.

It is theoretically possible to resonate the vibrating body, which is formed by the rigid elastic plate and the piezoelectric element mounted on the rigid elastic plate, so that a necessary vibration amount is realized by, for example, setting the frequency of the drive voltage applied to the piezoelectric element to a frequency in the vicinity of the resonance frequency of the vibrating body.

However, a phase of a frequency response of a vibrating operation of the vibration body with respect to the voltage applied to the piezoelectric element changes largely in the vicinity of the resonance frequency of the piezoelectric element in a state of being mounted.

Therefore, to precisely control the phases of the ultrasonic waves emitted by the plurality of piezoelectric elements while setting the frequency of the drive voltage applied to the piezoelectric elements to a frequency in the vicinity of the resonance frequency of the vibrating bodies in which the piezoelectric elements are respectively mounted, it is necessary to suppress as much as possible "variation" in the resonance frequency among the plurality of vibrating bodies, which is very difficult.

In this respect, the applicant of the present application filed a patent application regarding an ultrasonic transducer including a rigid elastic plate such as a metal plate formed with a plurality of opening parts in parallel, penetrating the rigid substrate between a bottom surface and a top surface thereof, a flexible resin film that is provided so as to cover an entire surface of the rigid elastic plate, and a plurality of piezoelectric elements that are fixed to a top surface of the resin film so as to overlap with the plurality of opening parts, respectively, in a plan view, and the patent application has been patented (see Patent Literature 2 shown below).

The ultrasonic transducer disclosed in the Patent Literature 2 is useful in that the vibrating body including the piezoelectric element can be vibrated with a sufficiently large vibration amount so that the sound pressure of the ultrasonic waves generated by the vibrating body is increased even in a case where the resonance frequency of the vibrating body is set to 70 kHz-80 kHz higher than 40 kHz that is a frequency of a drive voltage applied to the piezoelectric element. However, the inventor of the present application has been working hard and found that it may be difficult to emit ultrasonic waves toward a given direction in a case where the number of the vibrating bodies including the piezoelectric elements is increased.

PRIOR ART DOCUMENT

Patent Literature

Patent Literature 1: Japanese Patent No. 6499097
Patent Literature 2: Japanese Patent No. 6776481

SUMMARY

The present disclosure has been made in consideration of the conventional technology, and it is a first object to provide an ultrasonic transducer capable of realizing a sufficiently high sound pressure of ultrasonic waves even if a resonance frequency of a vibrating body including a piezoelectric element is set to be higher than a driving frequency of the vibrating body and also capable of realizing the sufficient sound pressure of the ultrasonic waves emitted by the vibrating bodies even if the number of the vibrating bodies is increased.

In order to achieve the object, the present disclosure provides an ultrasonic transducer including: a supporting plate having first and second surfaces on one side and the other side in a thickness direction, the supporting plate being provided with a plurality of concave portions opened to the first surface, and a plurality of waveguides having first end portions on one side that are respectively opened to bottom surfaces of the plurality of concave portions and that have opening widths smaller than those of the corresponding concave portions and second end portions on the other side that are opened to the second surface to form sound wave radiation openings; a flexible resin film that is fixed to the first surface of the supporting plate so as to cover the plurality of concave portions; and the same number of piezoelectric elements as the concave portions that are fixed to a first surface of the flexible resin film so that their center regions overlap, in a plan view, with the corresponding concave portions and their peripheral regions overlap, in a plan view, with the first surface of the supporting plate, wherein a vibrating body formed by the piezoelectric element and the flexible resin film has a resonance frequency of the lowest flexural vibration mode higher than a driving frequency of the piezoelectric element, and wherein the supporting plate is configured so that a resonance frequency of the lowest flexural vibration mode of the entire of the ultrasonic transducer is higher than the driving frequency of the piezoelectric element.

The ultrasonic transducer according to the present disclosure makes it possible to realize a sufficiently high sound pressure of ultrasonic waves even if a resonance frequency of a vibrating body including the piezoelectric element is set to be higher than a driving frequency of the vibrating body and also realize the sufficient sound pressure of the ultrasonic waves emitted by the vibrating bodies even if the number of the vibrating bodies is increased.

In a preferable configuration, an arrangement pitch of the plurality of piezoelectric elements is equal to or less than 4.3 mm.

In this configuration, the piezoelectric element is configured to have a rectangular shape in the plan view having longitudinal and lateral dimensions in the plan view with a maximum value of 4.0 mm or less, a circular shape in the plan view having a diameter of 4.0 mm or less, or an elliptical shape in the plan view having a major axis of 4.0 mm or less, and the concave portion is configured to have a shape similar to the shape of the piezoelectric element in the plan view so that an overlapping width in the plan view of the peripheral region of the piezoelectric element and the supporting plate is 0.05 mm-0.1 mm.

In a more preferable configuration, the concave portion is configured to have a depth of 0.05 mm-0.15 mm.

In any one of the above-mentioned various configurations, at least a part of the supporting plate in a thickness direction where the plurality of waveguides are formed is formed of ceramics.

In any one of the above-mentioned various configurations, the supporting plate is configured to include a first plate body with a plurality of concave-portion-directed through-holes having opening widths same as those of the plurality of concave portions, respectively, and a second plate body with a plurality of waveguide-directed through-holes having opening widths same as those of the plurality of waveguides, respectively, and the first and second plate bodies are fixed to each other in a state of being laminated in the thickness direction.

In a more preferable configuration, the second plate body is formed of ceramics.

In any one of the above-mentioned various configurations, the waveguide is preferably configured to have a tubular part including the first end portion opened to the bottom surface of the concave portion, and a horn part including the second end portion opened to the second surface of the supporting plate.

The tubular part is configured to have an opening width that is smaller than that of the concave portion and that is constant over the thickness direction, and the horn part is configured to have an opening width that is increased as it comes close to the sound wave radiation opening opened to the second surface of the supporting plate from a proximal end side connected to the tubular part.

In a more preferable configuration, the tubular part is configured so that a ratio of the opening width of the tubular part with respect to a wavelength of a sound wave emitted by the vibrating body is within a range of 0.15-0.2.

In a more preferable configuration, the tubular part is configured so that a ratio of a length of the tubular part with respect to a wavelength of a sound wave emitted by the vibrating body is less than or equal to 0.09, and 0.035 in a more preferable configuration.

In any one of the above-mentioned various configurations, the sound wave radiation opening is preferably configured so that a ratio of an opening width of the sound wave radiation opening with respect to an arrangement pitch of the plurality of piezoelectric elements is within a range of 0.8-0.95.

The ultrasonic transducer according to the present disclosure may further include: a lower sealing plate that includes a plurality of piezoelectric-element-directed openings having sizes surrounding the plurality of piezoelectric elements and that is thicker than the piezoelectric element, the lower sealing plate being fixed to the flexible resin film so that the plurality of piezoelectric elements are positioned within the plurality of piezoelectric-element-directed openings in the plan view, respectively; and a wiring assembly fixed to the lower sealing plate.

The wiring assembly is configured to include an insulating base layer, a conductive layer including first and second wirings that are arranged on the base layer and that are electrically connected to a pair of first and second application electrodes, respectively, of the piezoelectric element, and an insulative cover layer that covers the conductive layer. The base layer is configured to have a first wiring/piezoelectric element connection opening for electrically connecting the first wiring to the first electrode of the corresponding piezoelectric element and a second wiring/piezoelectric element connection opening for electrically connecting the second wiring to the second electrode of the corresponding piezoelectric element.

The ultrasonic transducer according to the present disclosure may further include an upper sealing plate fixed to the lower sealing plate and the wiring assembly via a flexible resin.

The upper sealing plate is provided with opening parts at positions corresponding to the plurality of piezoelectric elements.

The ultrasonic transducer according to the present disclosure may further include a sound absorbing material fixed to the upper sealing plate so as to cover the plurality of opening parts of the upper sealing plate.

The ultrasonic transducer according to the present disclosure may further include a reinforcing plate fixed to the sound absorbing material.

The present disclosure also provides a manufacturing method of an ultrasonic transducer that includes a supporting plate provided with a plurality of concave portions that are opened to a first surface on one side in a thickness direction, and a plurality of waveguides having first end portions on one side that are respectively opened to bottom surfaces of the plurality of concave portions and that have opening widths smaller than those of the concave portions and second end portions on the other side that are opened to a second surface on the other side in the thickness direction to form sound wave radiation openings; a flexible resin film that is fixed to the first surface of the supporting plate so as to cover the plurality of concave portions; and the same number of piezoelectric elements as the concave portions that are fixed to a first surface of the flexible resin film so that their center regions overlap, in a plan view, with the corresponding concave portions and their peripheral regions overlap, in a plan view, with the first surface of the supporting plate; wherein a vibrating body formed by the piezoelectric element and the flexible resin film has a resonance frequency of the lowest flexural vibration mode higher than a driving frequency of the piezoelectric element, and wherein the supporting plate is configured so that a resonance frequency of the lowest flexural vibration mode of the entire of the ultrasonic transducer is higher than the driving frequency of the piezoelectric element, the method including: a supporting plate forming step of forming the supporting plate; a flexible resin film fixing step of fixing the flexible resin film to the supporting plate by an adhesive or thermocompression bonding to cover the plurality of concave portions; a piezoelectric element fixing step of fixing the plurality of piezoelectric elements to the flexible resin film by an insulative adhesive in such a manner that the center regions overlap in the plan view with the corresponding concave portions and the peripheral regions overlap in the plan view with the supporting plate; a lower sealing plate arranging step of preparing a lower sealing plate that has a plurality of piezoelectric-element-directed openings having sizes surrounding the plurality of piezoelectric elements, respectively, and that is thicker than the piezoelectric element, and then fixing the lower sealing plate to the flexible resin film by an adhesive so that the plurality of piezoelectric elements are arranged within the plurality of piezoelectric-element-directed openings in the plan view; a wiring assembly preparation step of preparing a wiring assembly that includes an insulating base layer, a conductor layer including first and second wirings that are arranged on the base layer and that are electrically connected to a pair of first and second application electrodes, respectively, of the piezoelectric element, and an insulative cover layer enclosing the conductive layer, the base layer being provided with first and second wiring/piezoelectric element connection openings that respectively expose parts of the first and second wirings; a wiring assembly fixing step of fixing the base layer to the lower sealing plate by an adhesive; and an electric connection step of electrically connecting the portion of the first wiring that is exposed through the first wiring/piezoelectric element connection opening and the portion of the second wiring that is exposed through the second wiring/piezoelectric element connection opening to the first and second electrodes of the piezoelectric element, respectively.

The manufacturing method according to the present disclosure makes it possible to efficiently manufacture the ultrasonic transducer.

In a preferable configuration, the supporting plate forming step may include a process of preparing a concave-portion-directed plate that has a thickness same as a depth of the plurality of concave portions and that is provided with a plurality of through holes having opening widths same as those of the concave portions, a process of preparing a waveguide-directed plate that has a thickness same as a length of the plurality of waveguides and that is provided with a plurality of through holes having opening widths same as those of the waveguides, and a plate fixing process of fixing the concave-portion-directed plate and the waveguide-directed plate to each other by adhesive.

In a preferable configuration, the process of preparing the waveguide-directed plate is configured to inject ceramics material into a waveguide-plate-directed die that has a model depth same as the length of the plurality of waveguides and that is provided with a structure for forming a plurality of through holes having opening widths same as the opening widths of the plurality of the waveguides, respectively, and then bake the ceramics material.

In one aspect, the process of preparing the concave-portion-directed plate is configured to inject ceramics material into a concave-portion-directed die that has a model depth same as the length of the plurality of concave portions and that is provided with a structure for forming a plurality of through holes having opening widths same as those of the plurality of the concave portions, respectively, and then bake the ceramics material.

In another aspect, the process of preparing the concave-portion-directed plate is configured to prepare a metal plate having a thickness same as a depth of the plurality of concave portions, and then etch the metal plate so as to form a plurality of through holes having opening widths same as those of the concave portions 15, respectively.

DETAILED DESCRIPTION

First Aspect

One aspect of an ultrasonic transducer according to the present invention will be described below with reference to the accompanying drawings.

Figure 1:
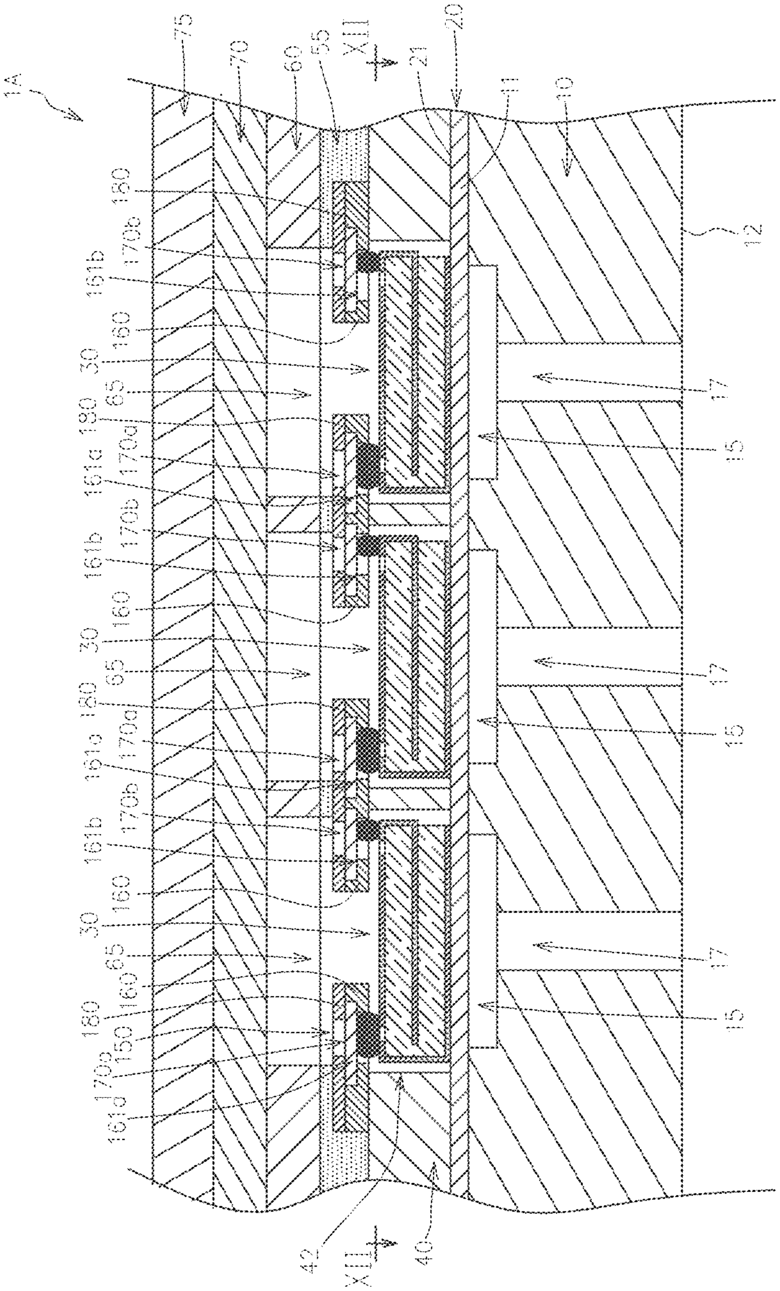
FIG. 1 is a vertical cross-sectional view of a part of an ultrasonic transducer according to a first aspect of the present disclosure.

FIG. 1 illustrates a part of a vertically cross-sectional view of an ultrasonic transducer 1.

The ultrasonic transducer 1 includes, as main components, a rigid supporting plate 10 having first and second surfaces 11, 12 that are positioned on one and the other side in a thickness direction, respectively; a flexible resin film 20 having first and second surfaces 21, 22 that are positioned on one and the other sides in the thickness direction, the second surface 22 being fixed to the first surface 11 of the supporting plate 10; and a plurality of piezoelectric elements 30 fixed to the first surface 21 of the flexible resin film 20.

Figure 2:
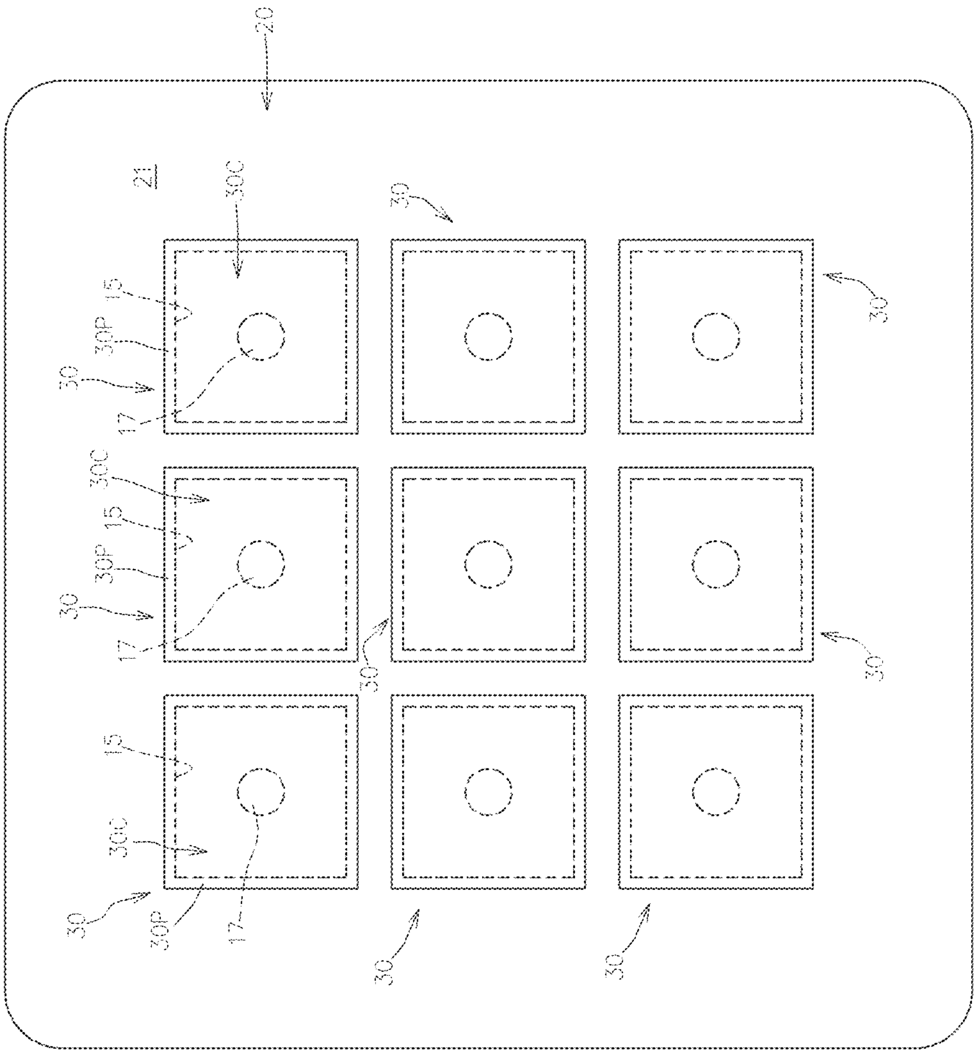
FIG. 2 is a plan view of a piezoelectric body assembly (a supporting plate, a flexible resin film and a plurality of piezoelectric elements) of the ultrasonic transducer according to the first aspect.

FIG. 2 illustrates a plan view of a piezoelectric body assembly including the supporting plate 10, the flexible resin film 20 fixed to the first surface 11 of the supporting plate 10, and the plurality of (nine in a 3×3 arrangement in the present aspect) piezoelectric elements 30.

Figure 3:
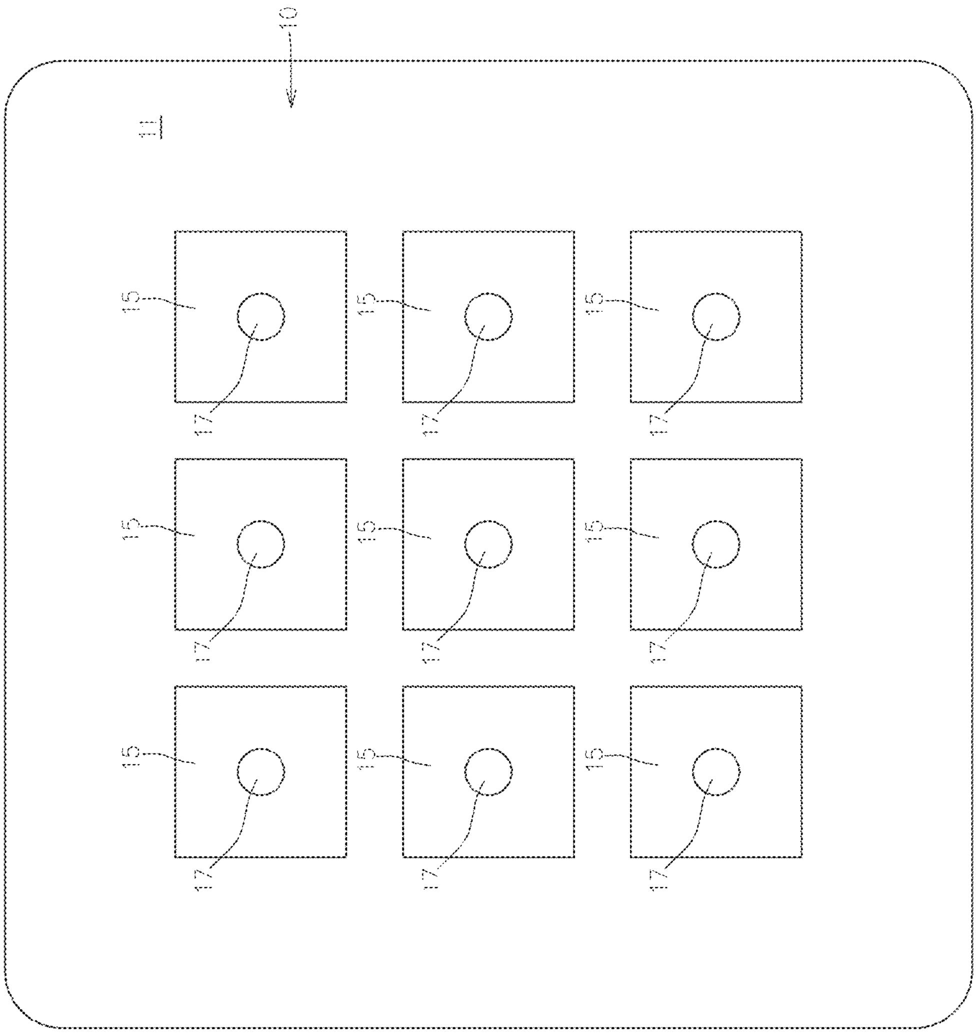
FIG. 3 is a plan view of the supporting plate.

Further, FIG. 3 illustrates a plan view of the supporting plate 10.

As illustrated in FIGS. 1 to 3, the supporting plate 10 is provided with a plurality of (nine in a 3×3 arrangement) concave portions 15 opened to the first surface 11 of the supporting plate 10, and a plurality of (nine in a 3×3 arrangement) waveguides 17 having first end portions on one side that are respectively opened to bottom surfaces of the plurality of concave portions 15 and second end portions on the other side that are opened to the second surface 12 of the supporting plate 10.

In the present aspect, the waveguide 17 is formed to be a tubular shape having an opening width that is smaller than that of the concave portion 15 and that is uniform over the thickness direction.

The supporting plate 10 may be formed of various rigid materials including a metal such as stainless steel and, in a preferable aspect, ceramics such as SiC and $Al_2O_3$ having density smaller than and Young's modulus higher than metal.

As shown in FIG. 1, in the present aspect, the supporting plate 10 is formed by a single plate that integrally includes a part formed with the plurality of concave portions 15 and a part formed with the plurality of waveguides 17. However, the present invention is not limited to such a configuration.

Figure 4:
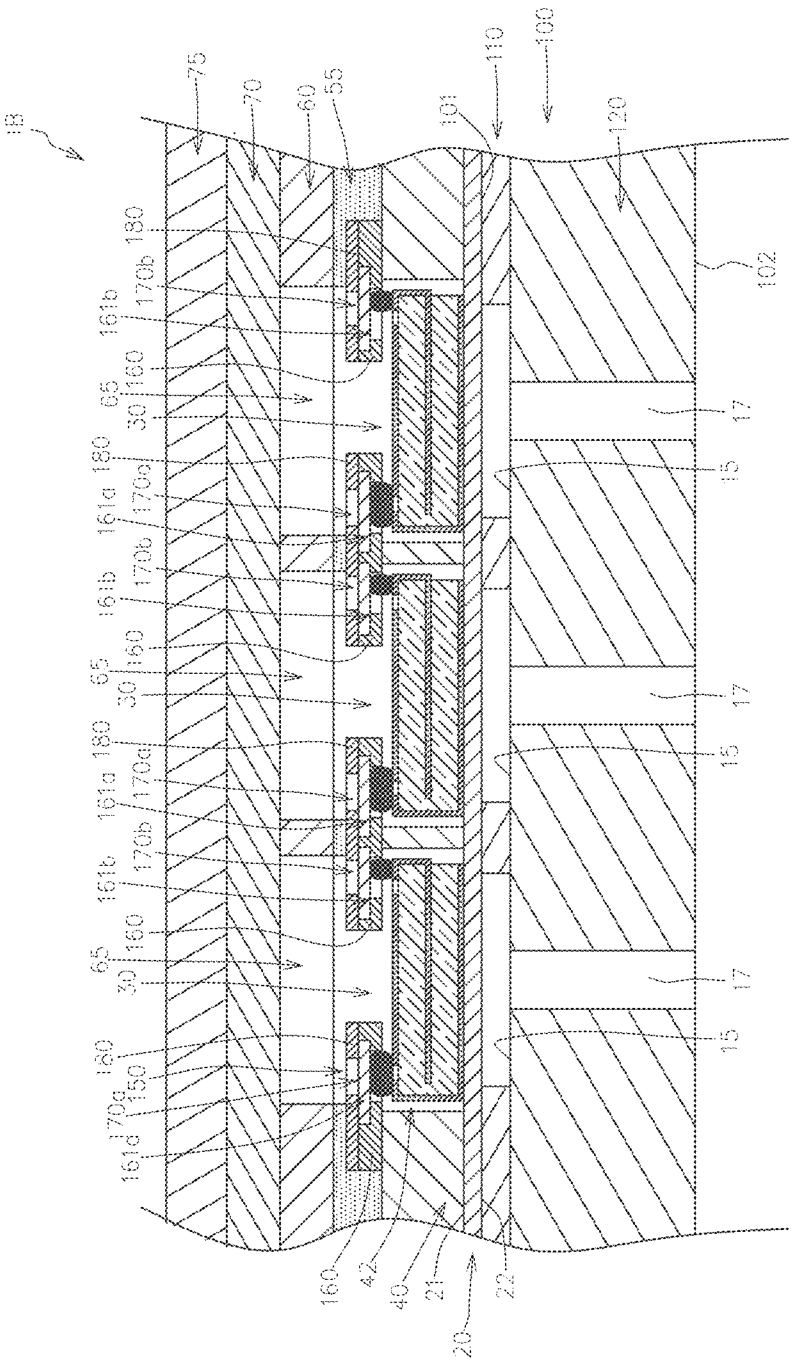
FIG. 4 is a vertical cross-sectional view of a part of an ultrasonic transducer according to a modified example of the first aspect.

FIG. 4 illustrates a vertical cross-sectional view of a part of an ultrasonic transducer 1B according to a modified example of the present aspect.

The ultrasonic transducer 1B is different from the ultrasonic transducer 1 only in that the supporting plate 10 is replaced by a supporting plate 100.

The supporting plate 100B includes a first plate body 110 formed with the plurality of concave portions 15 and a second plate body 120 that is separate from the first plate body 110 and that is formed with the plurality of waveguides 17, the first and second plate body 110, 120 being fixed to each other in a state of being laminated in the thickness direction.

Specifically, in the supporting plate 100, a surface of the first plate body 110 that is opposite from the second plate body 120 forms a first surface 101 on one side in the thickness direction of the supporting plate 100, and a surface of the second plate body 120 that is opposite from the first plate body 110 forms a second surface 102 on the other side in the thickness direction of the supporting plate 100.

The supporting plate 100 may be easily formed by forming, in the first plate body 110, a plurality of concave-portion-directed through-holes having opening widths same as those of the concave portions 15, forming, in the second plate body 120, a plurality of waveguide-directed through-holes having opening widths same as those of the waveguides 17, and then fixing the first and second plate body 110, 120 to each other in a state of being laminated in the thickness direction.

Although the supporting plate 110 may be also formed of various rigid materials including a metal such as stainless steel and ceramics such as SiC and $Al_2O_3$, the second plate body 120 thicker than the first plate body 110 is preferably formed of ceramics such as SiC and $Al_2O_3$ having density smaller than and Young's modulus higher than metal.

The flexible resin film 20 is fixed to the first surface 11 (101) of the supporting plate 10 (100) so as to cover the plurality of concave portions 15.

The flexible resin film 20 is formed of an insulating resin such as polyimide having a thickness of 20 μm to 100 μm, for example.

The flexible resin film 20 is fixed to the supporting plate 10 (100) by various methods such as an adhesive or thermocompression bonding.

As shown in FIG. 2, the piezoelectric element 30 is fixed to the first surface 21 of the flexible resin film 20 in such a manner that a center region 30C of the piezoelectric element 30 overlaps with the corresponding concave portion 15 and a peripheral region 30P of the piezoelectric element 30 overlaps with the first surface 11 (101) of the supporting plate 10 (110) in a plan view.

Figure 5B:
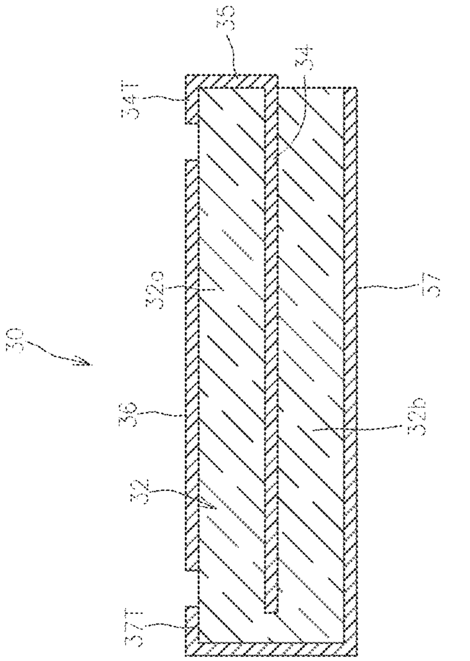
FIG. 5B is a cross-sectional view along line V-V in FIG. 5A.
Figure 5A:
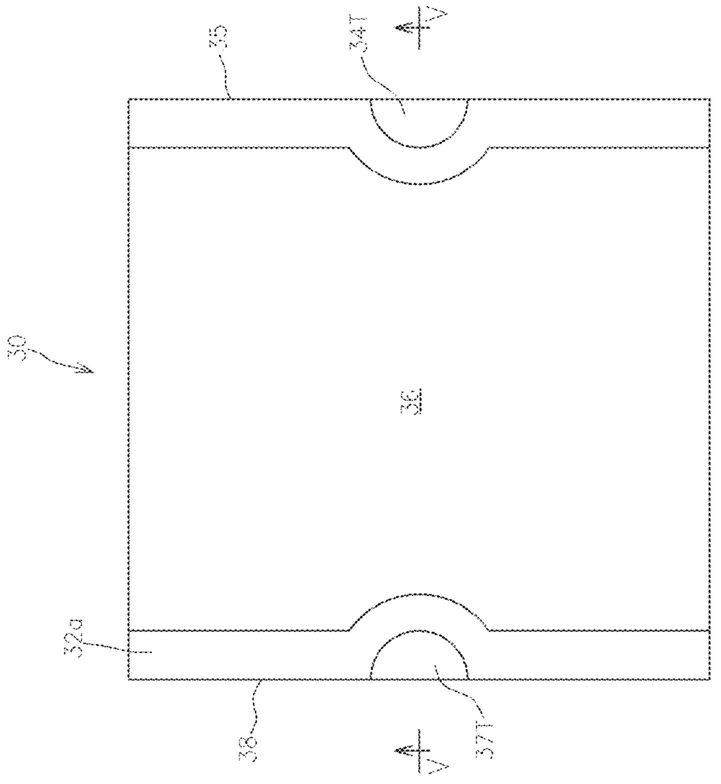
FIG. 5A is a plan view of the piezoelectric element.

FIG. 5A illustrates a plan view of the piezoelectric element 30.

Further, FIG. 5B illustrates a cross-sectional view along line V-V in FIG. 5A.

The piezoelectric element 30 includes a piezoelectric element main body 32 and a pair of first and second application electrodes, and is configured to expand and contract when a voltage is applied between the first and second application electrodes.

The piezoelectric element 30 is preferably a laminated type piezoelectric element.

With the laminated type piezoelectric element, it is possible to increase the electric field strength when the same voltage is applied and increase the expansion/contraction displacement per applied voltage as compared with a single-layer type piezoelectric element.

As illustrated in FIG. 5B, in the present aspect, the piezoelectric element 30 is a two-layer laminated type piezoelectric element.

Specifically, the piezoelectric element 30 includes the piezoelectric element main body 32 formed of a piezoelectric material such as lead zirconate titanate (PZT), an inner electrode 34 that partitions the piezoelectric element main body 32 into a first piezoelectric portion 32*a* on an upper side and a second piezoelectric portion 32*b* on a lower side in a thickness direction, a top surface electrode 36 fixed to a part of a top surface of the first piezoelectric portion 32*a*, a bottom surface electrode 37 fixed to a bottom surface of the second piezoelectric portion 32*b*, an inner electrode connection member 35 of which one end part is electrically connected to the inner electrode 34 and the other end part forms an inner electrode terminal 34T accessible at the top surface of the first piezoelectric portion 32*a* while being insulated from the top surface electrode 36, and a bottom surface electrode connection member 38 of which one end part is electrically connected to the bottom surface electrode 37 and the other end part forms a bottom surface electrode terminal 37T accessible at the top surface of the first piezoelectric portion 32*a* while being insulated from the top surface electrode 36 and the inner electrode 34.

In this case, an outer electrode formed by the top surface electrode 36 and the bottom surface electrode 37 acts as a first application electrode, and the inner electrode 34 acts as a second application electrode.

In the piezoelectric element 30, the first and second piezoelectric portions 32*a* and 32*b* have the same polarization direction in the thickness direction, and thus, when a predetermined voltage is applied between the outer electrode and the inner electrode 34 at a predetermined frequency, electric fields in opposite directions are applied to the first and second piezoelectric portions 32*a* and 32*b*.

As described above, the top surface electrode 36 and the bottom surface electrode 37 are insulated from each other. Therefore, when the piezoelectric element 30 is formed, it is possible to apply a voltage between the top surface electrode 36 and the bottom surface electrode 37 so that the polarization directions of the first and second piezoelectric portions 32*a* and 32*b* may be the same.

In the ultrasonic transducer 1A (1B), the piezoelectric element 30 and the flexible resin film 20 forms a vibrating body that generates an ultrasonic wave. The vibrating body is configured to have a resonance frequency of the lowest flexural vibration mode higher than a frequency (driving frequency) of a voltage applied to the piezoelectric element 30.

Specifically, to detect an object several meters ahead by a phased array in which a plurality of piezoelectric elements forming vibrating bodies are arranged in parallel, as in the ultrasonic transducer 1A (1B) according to the present aspect, it is necessary to precisely control phases of ultrasonic waves emitted from the plurality of vibrating bodies in which the plurality of piezoelectric elements 30 are respectively mounted.

For example, in a phased array in which a plurality of piezoelectric elements are arranged in parallel directly on a rigid supporting plate such as stainless steel, it is necessary to expand and contract the piezoelectric element against the rigidity of the rigid supporting plate so that the vibrating bodies that are formed by the piezoelectric elements and the rigid supporting plate make flexural vibrations with a predetermined amplitude, to secure a level of generated sound pressure.

For this purpose, it is necessary to set a frequency (driving frequency) of the voltage applied to the piezoelectric elements to a frequency in the vicinity of a resonance frequency of the vibrating body in which the piezoelectric element is mounted.

However, in the vibrating body on which the piezoelectric element is mounted, a phase of a frequency response of a vibrating operation of the vibrating body with respect to the voltage applied to the piezoelectric element changes largely in the vicinity of the resonance frequency of the vibrating body.

Therefore, to precisely control the phases of the ultrasonic waves generated by the plurality of piezoelectric elements with the aim of achieving the function of a phased array sensor, it is necessary to suppress as much as possible "variation" in the resonance frequency among the plurality of vibrating bodies, which is very difficult.

With respect to this point, the ultrasonic transducer 1A (1B) according to the present aspect includes, as described above, the rigid supporting plate 10 provided with the plurality of concave portions 15 that are opened to the first surface 11 (101) and the plurality of waveguides 17 having the first end portions that are opened to the bottom surface of the corresponding concave portions 15 and the second end portions that are opened to the second surface 12 (102), the flexible resin film 20 fixed to the first surface 11 (101) of the supporting plate 10 so as to cover the plurality of concave portions 15, and the plurality of the piezoelectric elements 30 fixed to the first surface 21 of the resin film 20 in such a manner that the center regions 30C of the piezoelectric elements 30 overlap with the corresponding concave portions 15 and the peripheral regions 30P of the piezoelectric elements 30 overlaps with the first surface 11 (101) of the supporting plate 10 (110) in a plan view.

According to such a configuration, even if a resonance frequency of a flexural vibration mode of the vibrating body in which the piezoelectric element 30 is mounted is set to be higher than the driving frequency of the piezoelectric element 30, it is possible to sufficiently secure a vibration and an amplitude of the vibrating body.

Moreover, when the resonance frequencies of the plurality of vibrating bodies are higher than the driving frequency of the piezoelectric elements 30, even if there is a "variation" in the resonance frequencies of the plurality of vibrating bodies, there is no great difference in the phases of the frequency response of the flexural vibration of the plurality of vibrating bodies.

Therefore, the phases of the ultrasonic waves generated by the plurality of vibrating bodies can be precisely controlled.

Specifically, to detect an object several meters ahead by using the ultrasonic transducer 1A (1B) as a phased array sensor, it is necessary to cause the vibrating body in which the piezoelectric element 30 is mounted to emit a low-frequency ultrasonic wave of 30 kHz-50 kHz or the like.

When the resonance frequency of the vibrating body is set to a resonance frequency (for example, 70 kHz) sufficiently higher than the driving frequency (30 kHz-50 kHz) to the piezoelectric element 30, the sound pressure of the ultrasonic wave generated by the vibrating body can be increased by increasing the longitudinal and lateral dimensions of the piezoelectric element 30 in a plan view.

However, on the other hand, in a case where the plurality of piezoelectric elements 30 are arranged in parallel, as in the ultrasonic transducer 1A (1B) according to the present aspect, to suppress the generation of grating lobes in the ultrasonic waves emitted from the plurality of vibrating bodies in which the plurality of piezoelectric elements 30 are respectively mounted, it is necessary that an arrangement pitch of the plurality of piezoelectric elements 30 is equal to or less than half of a wavelength λ of the ultrasonic waves emitted from the piezoelectric elements 30.

Here, the wavelength λ of the ultrasonic wave having a frequency of 40 kHz is 8.6 mm, and thus, to suppress the generation of grating lobes while setting the frequency of the ultrasonic waves emitted by the piezoelectric elements 30 to 40 kHz, it is necessary that an arrangement pitch P (see FIG. 2) of the plurality of piezoelectric elements 30 is equal to or less than 8.6 mm/2=4.3 mm.

Therefore, it is preferable that the longitudinal and lateral dimensions of the piezoelectric element 30 in a plan view are 3.0 mm or more from the viewpoint of ensuring sound pressure, and 4.0 mm or less from the viewpoint of suppressing the generation of grating lobes.

In the present aspect, the piezoelectric element 30 is configured to have a square shape in a plan view.

It is noted that, instead of the above-described shape, the piezoelectric element 30 may also have a rectangular shape in a plan view including a straight rectangular shape having longitudinal and lateral dimensions in a plan view with a maximum value of 4.30 mm or less, a circular shape in a plan view having a diameter of 4.0 mm or less, or an elliptical shape in a plan view having a major axis of 4.0 mm or less.

The opening width of the concave portion 15 is set so that a resonance frequency of the lowest flexural vibration mode of the vibrating body formed by the piezoelectric element 30 and the flexible resin film 20 is higher than a frequency of a voltage applied to the piezoelectric element 30.

In a preferable configuration, the concave portion 15 is configured to have a shape similar to the shape of the piezoelectric element 30 in a plan view so that an overlapping width in a plan view of the peripheral region 30P of the piezoelectric element 30 and the supporting plate 10 (100) is 0.05 mm-0.1 mm over the entire circumference.

Specifically, in a case where the piezoelectric element 30 has a square shape in a plan view having one side of 4.0 mm, the concave portion 15 may preferably have a square shape in a plan view having one side of about 3.8 mm to 3.9 mm. In a case where the piezoelectric element 30 has a circular shape in a plan view having a diameter of 4.0 mm, the concave portion 15 may preferably have a circular shape in a plan view having a diameter of about 3.8 mm to 3.9 mm.

As illustrated in FIGS. 2 and 3 and the like, in the present aspect, the rigid supporting plate 10 (100) is provided with the concave portions 15 at nine locations in a 3×3 arrangement, and nine of the piezoelectric elements 30 are arranged to overlap with the nine concave portions 15, respectively, in a plan view, with the flexible resin film 20 sandwiched therebetween, and thus, nine vibrating bodies in which the nine piezoelectric elements 30 are respectively mounted are provided in a 3×3 arrangement. However, needless to say, the present invention is not limited to such a configuration.

To improve the directivity and increase the intensity of a radiation sound wave, it is desirable to arrange more vibrating bodies than in the 3×3 arrangement.

Hereinafter, analyses that the inventor of the present invention performed for examples of the present aspect are explained.

The inventor of the present invention has obtained a new and unique idea that, for precisely controlling phases of ultrasonic waves emitted from the plurality of vibrating bodies that are formed by the plurality of piezoelectric elements 30 and the flexible resin film 20, it may be necessary to take into consideration a resonance frequency of the lowest flexural vibration mode of the piezoelectric body assembly including the supporting plate 10 (100), the flexible resin film 20 and the plurality of piezoelectric elements 30 in addition to the configuration that the resonance frequency of the lowest flexural vibration mode of the plurality of vibrating bodies is set to be higher than the driving frequency of the piezoelectric elements 30, and performed following analyses based on the new and unique idea.

Analysis (1)

Figure 6A:
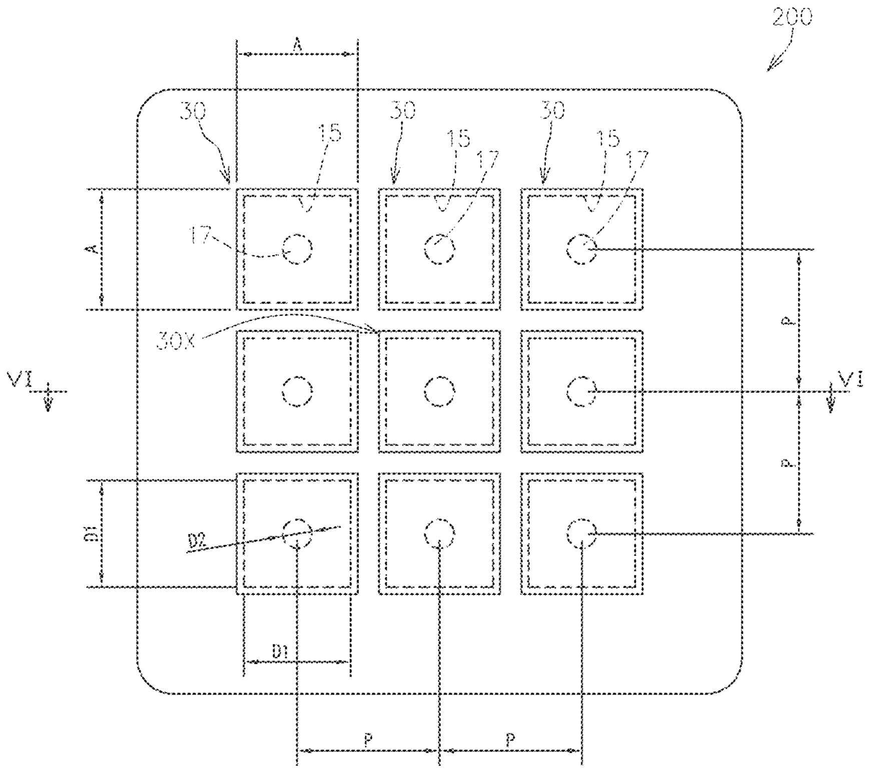
FIG. 6A is a plan view of a model (piezoelectric body assembly) of the first aspect on which finite element method (FEM) analyses are performed.

FIG. 6A illustrates a plan view of a model (piezoelectric body assembly) 200 used in this analysis.

Figure 6B:
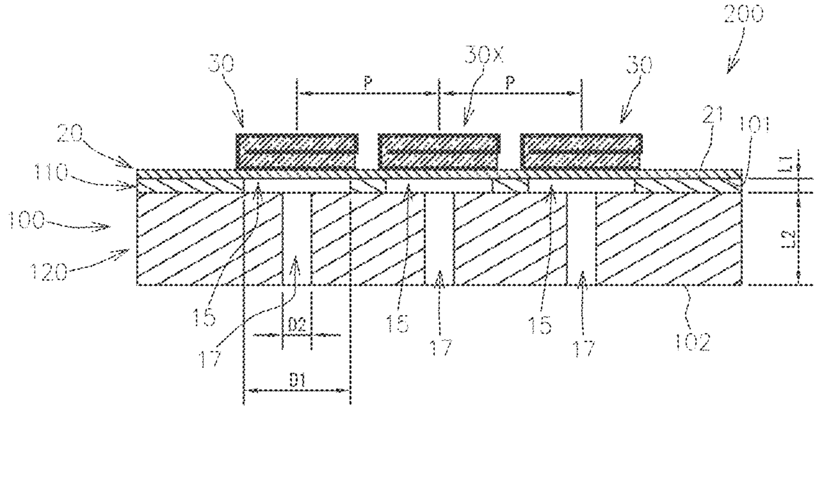
FIG. 6B is a cross-sectional view taken along the line VI-VI in FIG. 6A.

FIG. 6B illustrates a cross-sectional view taken along the line VI-VI in FIG. 6A.

As shown in FIGS. 6A and 6B, the model 200 has a configuration corresponding to the ultrasonic transducer 1B.

Specifically, the model 200 has the supporting plate 100 including the first and second plate bodies 110, 120, the flexible resin film 20 fixed to the first surface 101 of the supporting plate 100, and the nine piezoelectric elements 30 in a 3×3 arrangement fixed to the first surface 21 of the flexible resin film 20.

In the analysis (1), a relationship between a thickness L2 at a portion (the second plate body 120) where the waveguides 17 were formed and the resonance frequency of the lowest flexural vibration mode of the entire of the model was calculated by using a finite element method (FEM) analysis.

In the analysis (1), a shape and a size of the piezoelectric element 30, a material and a thickness of the flexible resin film 20, an opening width D1 of the concave portion 15, an opening width D2 of the waveguide 17, and an arrangement pitch P of the piezoelectric elements 30 were set to be as follows.

| | |
|---|---|
| Piezoelectric element 30: | Two-layer laminated type, thickness of one layer 0.13 mm (total thickness of 0.26 mm) Square shape in a plan view having one side length of A = 3.4 mm × 3.4 mm |
| Flexible resin film 20: | polyimide film having a thickness of 0.05 mm |
| Concave portion: | Square shape in a plan view having the opening width D1 = 3.3 mm |
| Waveguide: | Square shape in a plan view having the opening width D2 = 2.2 mm |
| Arrangement pitch: | P = 4.0 mm |

In examples 1-(1) to 1-(6) of the analysis (1), the material of the second plate body 120 was set to SiC, and the material of the first plate body 110 was set to be same as that of the second plate body 120.

In addition, the thickness L2 of the portion (the second plate body 120) where the waveguides 17 were formed and the thickness L1 of the portion (the first plate body 110) where the concave portions 15 were formed were set to be as follows.

| | |
|---|---|
| Example 1-(1): | L2 = 0.3 mm, L1 = 0.3 mm |
| Example 1-(2): | L2 = 0.6 mm, L1 = 0.3 mm |
| Example 1-(3): | L2 = 1.0 mm, L1 = 0.3 mm |
| Example 1-(4): | L2 = 1.2 mm, L1 = 0.3 mm |
| Example 1-(5): | L2 = 1.5 mm, L1 = 0.2 mm |
| Example 1-(6): | L2 = 2.0 mm, L1 = 0.1 mm |

In each of the examples 1-(1) to 1-(6), the resonance frequency of the lowest flexural vibration mode of the entire of the model was calculated.

Figure 7:
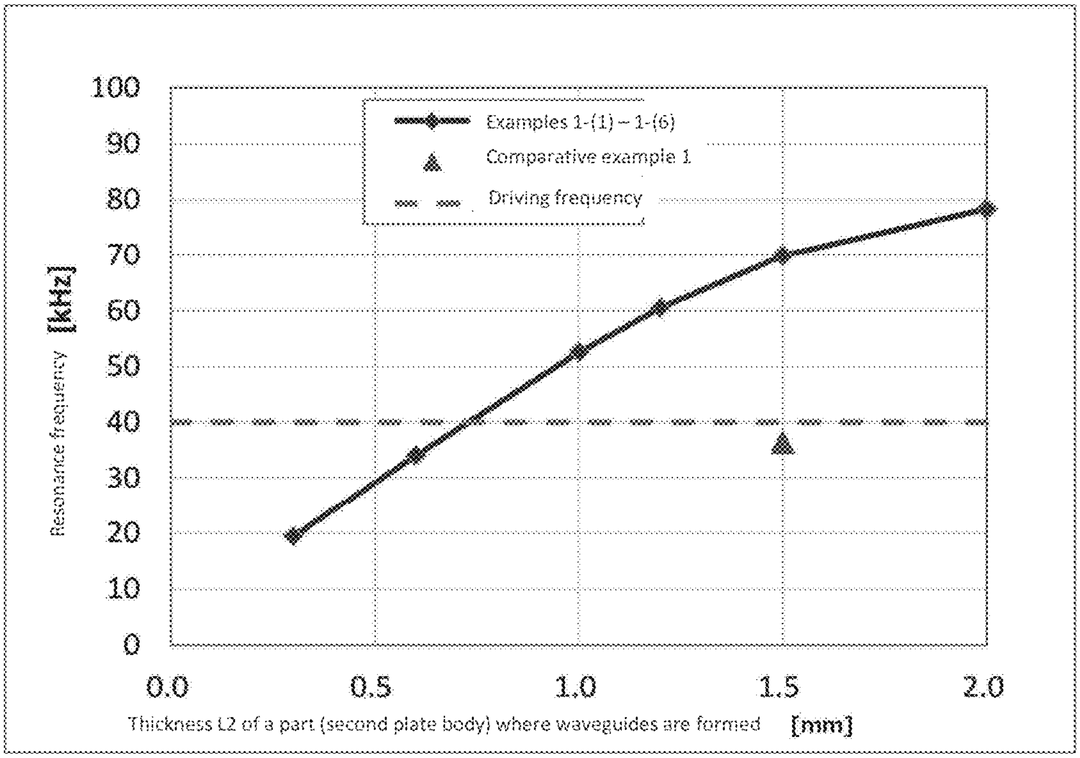
FIG. 7 is a graph showing a result of the finite element method analysis performed on the model in the model shown in FIGS. 6A and 6B for a relationship between a thickness L2 of a portion (second plate body) where a waveguide is formed and a resonance frequency of the lowest flexural vibration mode of the entire of the model.

The calculation results are shown in FIG. 7.

A resonance frequency of a comparative example 1 in which the material of the first and second plate bodies was stainless steel, the thickness L2 of the second plate body was 1.5 mm and the thickness L1 of the first plate body was 0.2 mm was calculated.

The calculation result is also shown in FIG. 7.

As shown in FIG. 7, it was confirmed that the resonance frequency of the entire model can be set to be sufficiently higher than 40 kHz, which is the frequency (that is, the driving frequency of the piezoelectric element 30) of the ultrasonic wave that the vibrating body including the piezoelectric body 30 should emit by forming the portion where the waveguides 17 were formed of ceramics and setting the thickness L2 to be more than 1.0 mm.

According to the configuration, it is effectively prevented or reduced that the ultrasonic waves emitted by the vibrating bodies are interfered with the sonic waves that may be generated by the vibration of the entire model (the piezoelectric body assembly).

In the comparative example 1 in which the first and second plate bodies 110, 120 were formed of stainless steel, the resonance frequency of the entire model was in the vicinity of the driving frequency of the piezoelectric body 30 in spite of setting the thickness L2 of the portion (the second plate body 120) where the waveguides were formed to be 1.5 mm.

In the comparative example 1, the ultrasonic waves emitted by the vibrating bodies are adversely affected by the sonic waves that may be generated by the vibration of the entire model (the piezoelectric body assembly).

Analysis (2)

The analysis (2) is for obtaining a relationship between the opening width D2 of the waveguide 17 and the sound pressure level of the radiation sound wave emitted by the vibrating body by using the finite element method analysis.

In a case where only a piezoelectric element 30X (see FIG. 6A) positioned at a center among the nine piezoelectric elements in a 3×3 arrangement of the model 200 is driven by a sine wave voltage having an amplitude of 10 V and a frequency of 40 kHz, a sound pressure distribution was calculated at a position away from the vibrating body including the piezoelectric element 30X by a distance of 0.3 meters on an imaginary vertical line that passes a center of the vibrating body including the piezoelectric element 30X and that is perpendicular to a plane on which the model 200 is arranged.

In the analysis (2), the thickness L1 of the portion (the first plate body 110) where the concave portions 15 were formed and the thickness L2 of the portion (the second plate body 120) where the waveguides 17 were formed were set to be as follows.

| | | | |
|---|---|---|---|
| Example 2a: | second plate body 120 | material SiC | L2 = 1.2 mm |
| | first plate body 110 | material SUS 304 | L1 = 0.2 mm |
| Example 2b: | second plate body 120 | material SiC | L2 = 1.5 mm |
| | first plate body 110 | material SUS 304 | L1 = 0.1 mm |

The opening width D2 of the waveguide 17 was set to be as follows.

| | |
|---|---|
| Example 2a-(1), Example 2b-(1): | D2 = 1.8 mm |
| Example 2a-(2), Example 2b-(2): | D2 = 2.0 mm |
| Example 2a-(3), Example 2b-(3): | D2 = 2.2 mm |

-continued

| | |
|---|---|
| Example 2a-(4), Example 2b-(4): | D2 = 2.4 mm |
| Example 2a-(5): | D2 = 3.2 mm |

Other conditions were set to be same as those in the analysis (1).

Figure 8:
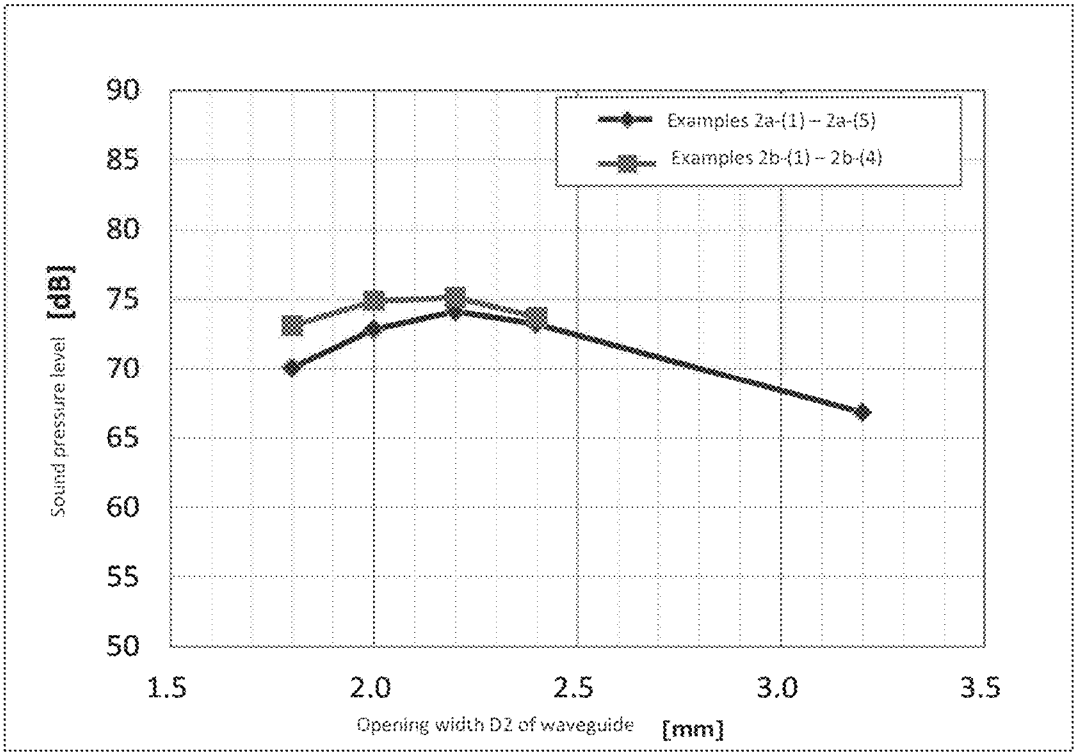
FIG. 8 is a graph showing a result of the finite element method analysis performed on the model shown in FIGS. 6A and 6B for a relationship between an opening width D2 of the waveguide and a sound pressure level of a radiation sound wave emitted by a vibrating body including the piezoelectric element.

The result of the analysis (2) is shown in FIG. 8.

As shown in FIG. 8, in both of Examples 2a and 2b, the sound pressure is maximized at a region where the opening width of the waveguide 17 is set to be 2.0 mm-2.5 mm.

Specifically, in a configuration in which a length of the waveguide 17 that is defined by the thickness L2 of the second plate body 120 is set to be 1.2 mm-1.5 mm, it is preferable to set the opening width D2 of the waveguide 11 to be 2.0 mm-2.5 mm.

Analysis (3)

The analysis (3) is for obtaining a relationship between the thickness L1 of the portion (the first plate body 110) where the concave portions 15 were formed and the sound pressure level of the radiation sound wave emitted by the vibrating body by using the finite element method analysis.

Also in the analysis (3), in a manner similar to the analysis (2), in a case where only the piezoelectric element 30X (see FIG. 6A) positioned at a center among the nine piezoelectric elements in a 3×3 arrangement in the model 200 is driven by the sine wave voltage having an amplitude of 10 V and a frequency of 40 kHz, the sound pressure distribution was calculated at a position away from the vibrating body including the piezoelectric element 30X by a distance of 0.3 meters on an imaginary vertical line that passes a center of the vibrating body including the piezoelectric element 30X and that is perpendicular to a plane on which the model 200 is arranged.

In the analysis (3), the thickness L2 of the portion (the second plate body 120) where the waveguides 17 were formed was set to be 1.5 mm, and the opening width D2 of the waveguide 17 was set to be 2.2 mm.

The material of the portion (the second plate body 120) where the waveguides 17 were formed was SiC.

In Examples 3-(1) to Examples 3-(4) in the analysis (3), the thickness of the portion (the first plate body 110) where the concave portions 15 were formed were set to be as follows.

The material of the portion (the first plate body 110) where the concave portions 15 were formed was same as the material (SiC) of the portion (the second plate body 120) where the waveguides 17 were formed.

| | |
|---|---|
| Example 3-(1): | L1 = 0.05 mm |
| Example 3-(2): | L2 = 0.10 mm |
| Example 3-(3): | L2 = 0.20 mm |
| Example 3-(4): | L2 = 0.30 mm |

Figure 9:
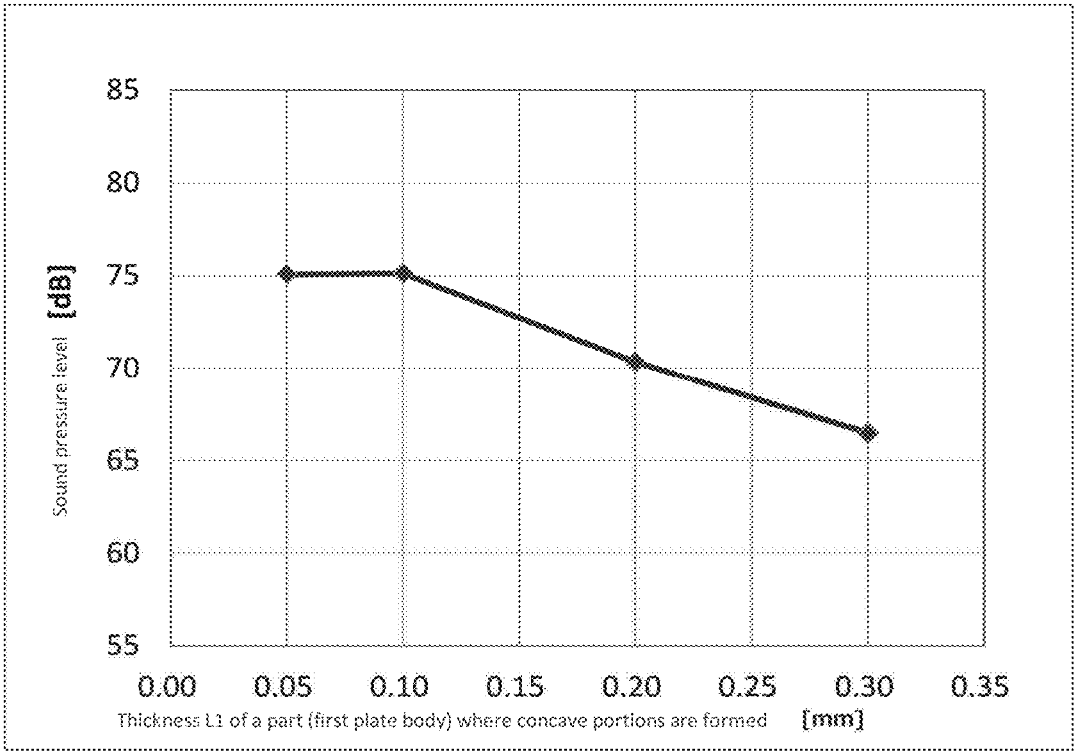
FIG. 9 is a graph showing a result of the finite element method analysis performed on the model in the model shown in FIGS. 6A and 6B for a relationship between a thickness L1 of a portion (first plate body) where concave portion is formed and the sound pressure level of the radiation sound wave emitted by the vibrating body.

The result of the analysis (3) is shown in FIG. 9

As apparent from FIG. 9, it is preferable that the thickness L1 of the portion (the first plate body 110) where the concave portions 15 are formed, that is, a depth of the concave portion 15 is set to be less than or equal to 0.15 mm. Moreover, since the sound pressure lever is maximized at a region where the depth is less than or equal to 0.1 mm, it is more preferable that the depth of the concave portion 15 is set to be less than or equal to 0.1 mm in view of the sound pressure.

On the other hand, forming the concave portion 15 to be excessively shallow may cause a following disadvantage.

Specifically, such a situation that adhesive agent or the like for fixing the flexible resin film 20 to the first surface 101 of the supporting plate 100 flows into the concave portion 15 may occurs. If such a situation occurs in a case where the concave portion 15 is formed to be excessively shallow, there may be a risk that movements of the vibrating bodies formed by the piezoelectric elements 30 and the flexible resin film 20 are inhibited.

In consideration of this point, it is preferable to set the depth of the concave portion 15 to be more than or equal to 0.05 mm.

Analysis (4)

Figure 10A:
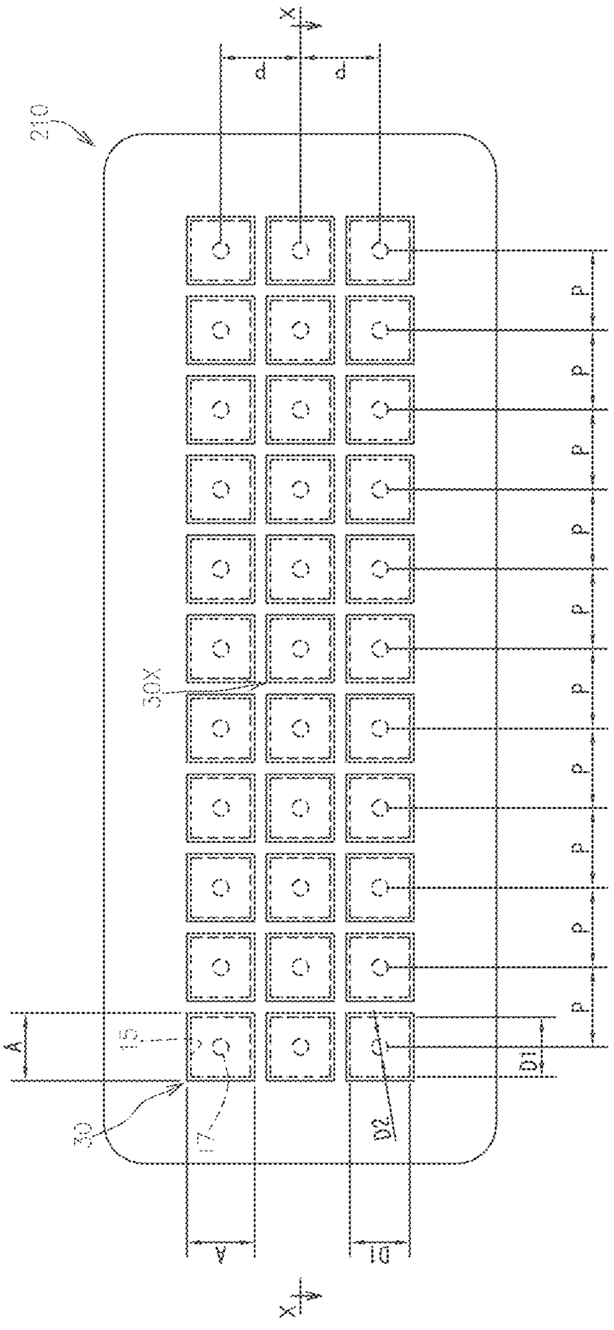
FIG. 10A is a plan view of another model (piezoelectric body assembly) of the first aspect on which finite element method (FEM) analyses are performed.

FIG. 10A illustrates a plan view of a model (piezoelectric body assembly) 210 used in this analysis.

Figure 10B:
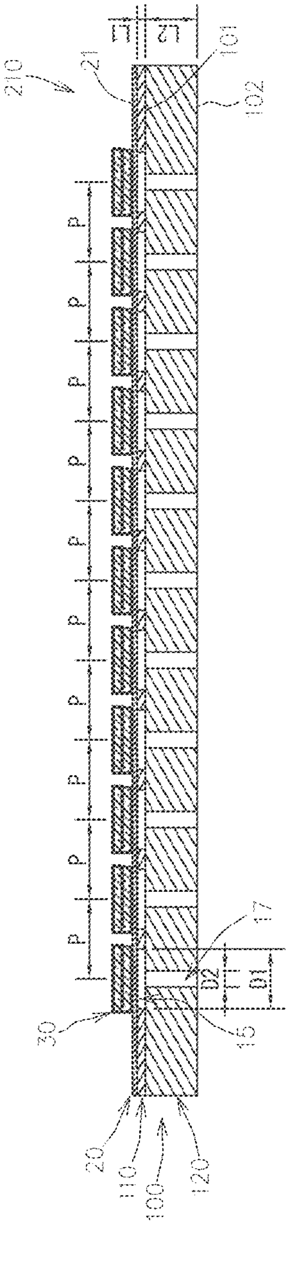
FIG. 10B is a cross-sectional view taken along the line X-X in FIG. 10A.

FIG. 10B illustrates a cross sectional view taken along the line X-X in FIG. 10A.

As shown in FIGS. 10A and 10B, the model 210 has the supporting plate 100 including the first and second plate bodies 110, 120, the flexible resin film 20 fixed to the first surface 101 of the supporting plate 100, and the thirty-three piezoelectric elements 30 in a 11×3 arrangement fixed to the first surface 21 of the flexible resin film 20.

As similar to the analysis (1), this analysis (4) is for calculating the relationship between the thickness L2 at the portion (the second plate body 120) where the waveguides 17 were formed and the resonance frequency of the lowest flexural vibration mode of the entire of the model.

In the analysis (4), the shape and the size of the piezoelectric element 30, the material and the thickness of the flexible resin film 20, the opening width D1 of the concave portion 15, the opening width D2 of the waveguide 17, and the arrangement pitch P of the piezoelectric elements 30 were set to be same as those in the analysis (1).

In the analysis (4), the thickness L1 of the portion (the first plate body 110) where the concave portions 15 were formed was set to be 0.1 mm.

The material of the portion (the first plate body 110) where the concave portions 15 were formed was SUS 304.

In addition, the thickness L2 and the material of the portion (the second plate body 120) where the waveguides 17 were formed were set to be as follows.

| | |
|---|---|
| Example 4-(1): | L2 = 1.5 mm, material SiC |
| Example 4-(2): | L2 = 2.0 mm, material SiC |
| Example 4-(3): | L2 = 2.5 mm, material SiC |
| Example 4-(4): | L2 = 3.0 mm, material SiC |
| Example 4-(5): | L2 = 3.0 mm, material $Al_2O_3$ |

In each of the examples 4-(1) to 4-(5), the resonance frequency of the lowest flexural vibration mode of the entire of the model was calculated.

Figure 11:
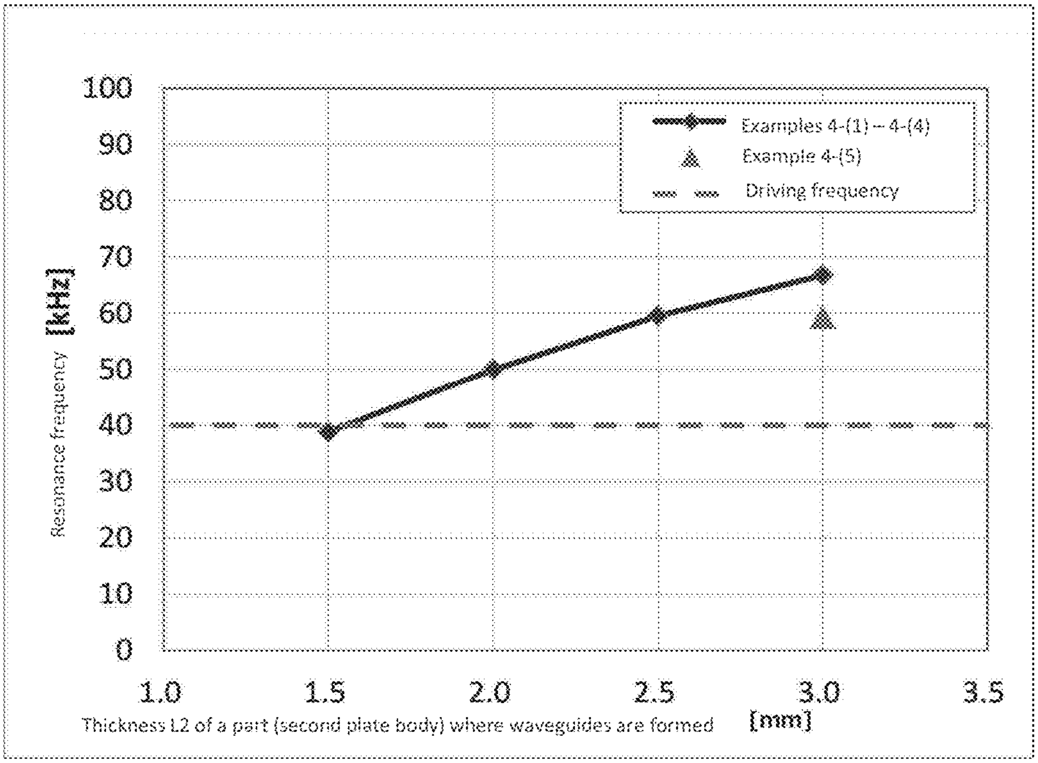
FIG. 11 is a graph showing a result of the finite element method analysis performed on the model in the model shown in FIGS. 11A and 11B for a relationship between the thickness L2 of the portion (second plate body) where the waveguide is formed and the resonance frequency of the lowest flexural vibration mode of the entire of the model.

The calculation results are shown in FIG. 11.

As apparent from FIG. 11, it was confirmed that the resonance frequency of the entire model including the piezoelectric elements 30 in a 11×3 arrangement can be set to be sufficiently higher than 40 kHz, which is the frequency (that is, the driving frequency of the piezoelectric element 30) of the ultrasonic wave that the vibrating body including the piezoelectric body 30 should emit by setting the thickness L2 of the portion (the second plate body 120) where the waveguides 17 were formed to be more than 2.0 mm and forming the portion where the waveguides 17 were formed of ceramics (Sic or $Al_2O_3$).

According to the configuration, it is effectively prevented or reduced that the ultrasonic waves emitted by the vibrating bodies are interfered with the sonic waves that may be generated by the vibration of the entire model (the piezoelectric body assembly).

Hereinafter, optional components of the ultrasonic transducer 1A (1B) will be explained.

The ultrasonic transducer 1A (1B) according to the present aspect includes a lower sealing plate 40 and a wiring assembly 150 as the optional components, in addition to the piezoelectric body assembly that is the main component.

Figure 12:
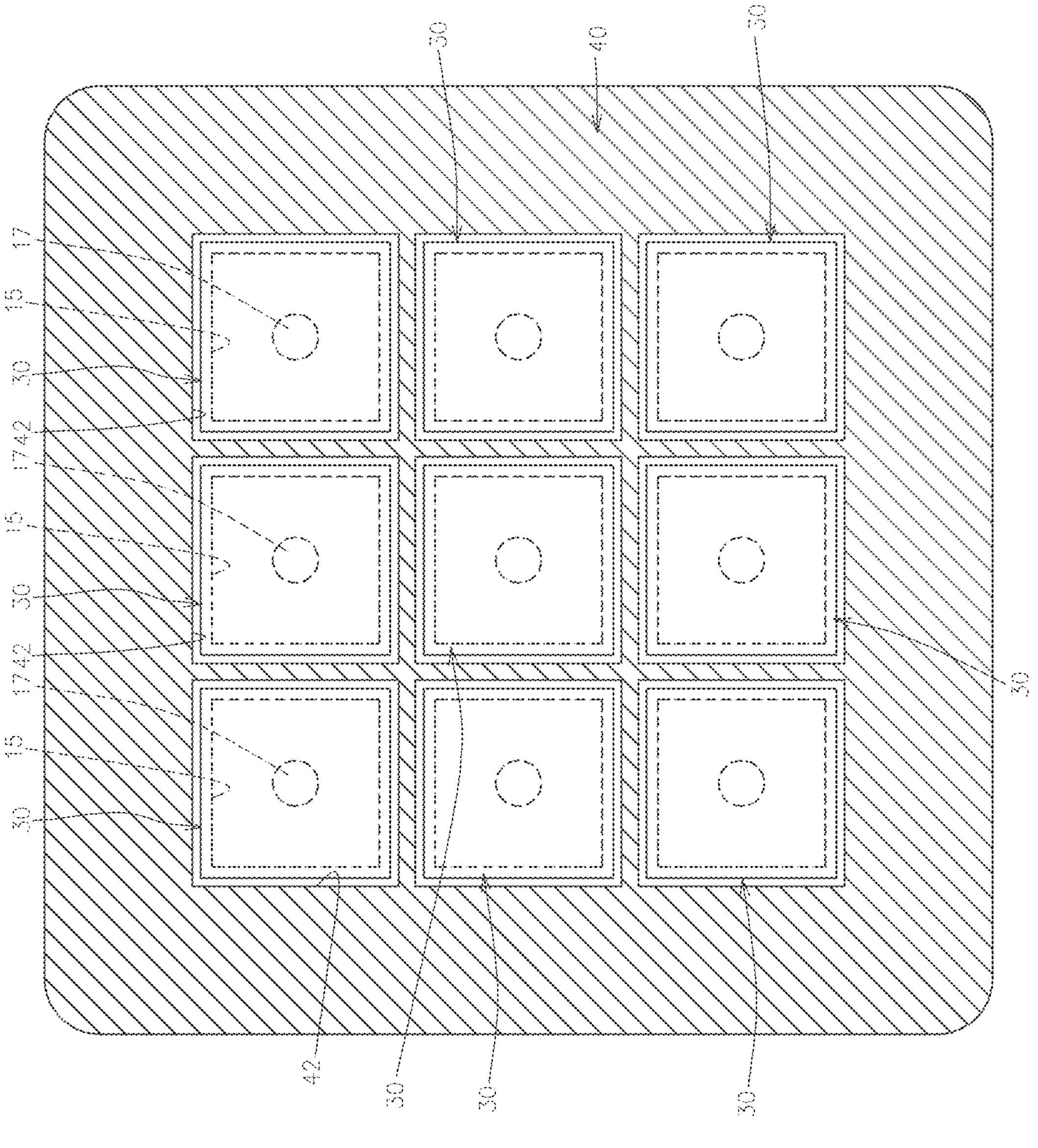
FIG. 12 is a cross-sectional view taken along the line XII-XII in FIG. 1.

FIG. 12 illustrates a cross-sectional view taken along the line XII-XII in FIG. 1.

As shown in FIG. 12, the lower sealing plate 40 includes a plurality of piezoelectric-element-directed openings 42 having a size surrounding the corresponding piezoelectric element 30. The lower sealing plate 40 is fixed to the first surface 21 of the flexible resin film 20 by means of adhesive agent, thermocompression bonding or the like so that the plurality of piezoelectric elements 30 is positioned within the plurality of piezoelectric-element-directed openings 42 in a plan view.

As shown in FIG. 1, the lower sealing plate 40 has a thickness greater than the piezoelectric element 30, so that a first surface of the lower sealing plate 40 is positioned farther away from the flexible resin film 20 than top surface electrode 36, the bottom surface electrode terminal 37T and the inner electrode terminal 34T (see FIG. 5) are.

The lower sealing plate 40 is formed of a rigid material including a metal such as stainless steel, carbon fiber reinforced plastic, ceramics, or the like.

The lower sealing plate 40 seals sides of a piezoelectric element group including the plurality of piezoelectric elements 30, and also acts as a mounting base to which the wiring assembly 150 is fixed.

The wiring assembly 150 is used for transmitting an applied voltage supplied from the outside to the plurality of piezoelectric elements 30.

As illustrated in FIG. 1, the wiring assembly 150 includes an insulating base layer 160 fixed to the lower sealing plate 40 by adhesive agent or the like, a conductor layer 170 fixed to the base layer 160, and an insulating cover layer 180 enclosing the conductor layer 170.

The base layer 160 and the cover layer 180 are formed of an insulating resin such as polyimide, for example.

The conductor layer 170 is formed of a conductive metal such as Cu, for example.

The conductor layer 170 may be formed by laminating a Cu foil that has a thickness of about 12 to 25 μm on the base layer 160 and then removing unnecessary portions from the Cu foil by etching.

An exposed portion of Cu forming the conductor layer 170 may be preferably plated with Ni and Au.

In the present aspect, the conductor layer 170 includes a first wiring 170*a* and a second wiring 170*b* that are respectively connected to a first electrode (the outer electrode 36, 37 in the present aspect) and a second electrode (the inner electrode 34 in the present aspect) of the piezoelectric element 30.

The base layer 160 is formed with a first wiring/piezoelectric element connection opening 161*a* for connecting the first wiring 170*a* to the corresponding first electrode of the piezoelectric element 30 and a second wiring/piezoelectric element connection opening 161*b* for connecting the second wiring 170*b* to the corresponding second electrode of the piezoelectric element 30.

In the present aspect, as described above, the top surface electrode 36 and the bottom surface electrode 37 act as the first electrode, and the inner electrode 34 acts as the second electrode.

Accordingly, a portion of the first wiring 170*a* that is exposed through the first wiring/piezoelectric element connection opening 161*a* is electrically connected to both of a part of the top surface electrode 36 and the bottom surface electrode terminal 37T by a conductive adhesive or solder, for example.

Also, a portion of the second wiring 170*b* that is exposed through the second wiring/piezoelectric element connection opening 161*b* is electrically connected to the inner electrode terminal 34T by a conductive adhesive or solder, for example.

The cover layer 180 is formed with a first wiring/outside connection opening and a second wiring/outside connection opening for electrically connecting the first and second wirings 170*a*, 170*b* to corresponding outside members, respectively.

As shown in FIG. 1, the ultrasonic transducer 1A according to the present aspect further includes an upper sealing plate 60 fixed to the top surfaces of the lower sealing plate 40 and the wiring assembly 150 via a flexible resin 55.

The upper sealing plate 60 includes opening parts 65 at positions corresponding to the plurality of piezoelectric elements 30.

With the upper sealing plate 60, it is possible to obtain a stable support state of the wiring assembly 150 while preventing an influence on a flexural vibration operation of the vibrating body as much as possible.

For example, the upper sealing plate 60 is formed of a metal such as stainless steel having a thickness of 0.1 mm to 0.3 mm, carbon fiber reinforced plastic, ceramics, and the like.

The ultrasonic transducer 1A according to the present aspect further includes a sound absorbing member 70 fixed to the top surface of the upper sealing plate 60 by adhesion or the like to cover the plurality of opening parts 65 of the upper sealing plate 60.

The sound absorbing member 70 is formed of a silicone resin having a thickness of about 0.3 mm to 1.5 mm or another foamed resin, for example.

With the sound absorbing member 70, it is possible to effectively prevent ultrasonic waves generated by the piezoelectric elements 30 from being emitted to a side opposite to the side to which the sound waves are to be emitted (lower side in FIG. 1).

The ultrasonic transducer 1A further includes a reinforcing plate 75 fixed to the top surface of the sound absorbing member 70 by adhesion or the like.

For example, the reinforcing plate 75 is formed of a metal such as stainless steel having a thickness of about 0.2 mm to 0.5 mm, carbon fiber reinforced plastic, ceramics, and the like.

With the reinforcing plate 75, it is possible to prevent an external force from affecting the supporting plate 10 and the piezoelectric elements 30 as much as possible.

A manufacturing method of the ultrasonic transducer 1A according to the present aspect will be described below.

Figure 13:
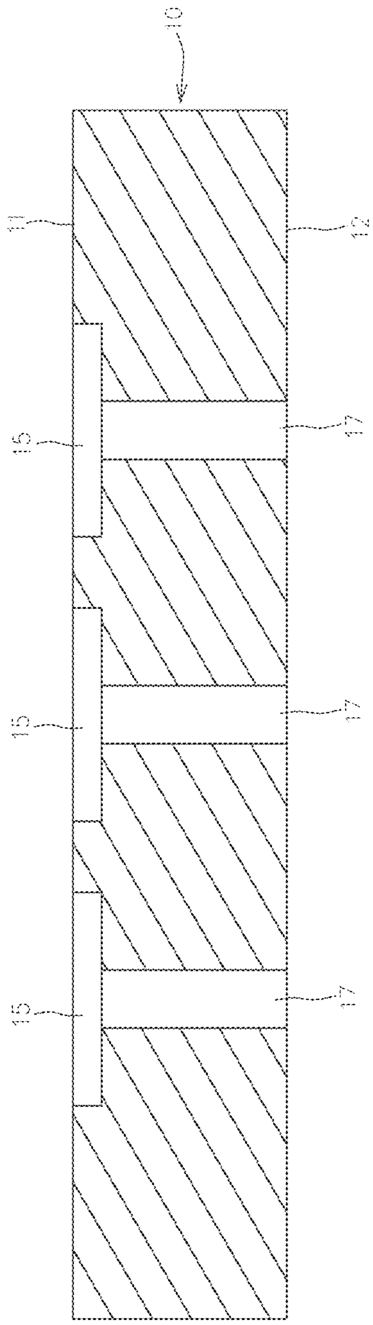
FIG. 13 is a cross-sectional view of a supporting plate formed by a supporting plate forming step in a manufacturing method of the ultrasonic transducer according to the first aspect.

The manufacturing method includes a supporting plate forming step (FIG. 13) of forming the supporting plate 10 with the plurality of concave portions 15 and the waveguides 17 by injecting ceramics material into a supporting-plate-directed die that has a mold depth same as the thickness of the supporting plate 10 and that is provided with a structure for forming the plurality of concave portions 15 and the plurality of the waveguides 17, and then baking.

Figure 14A:
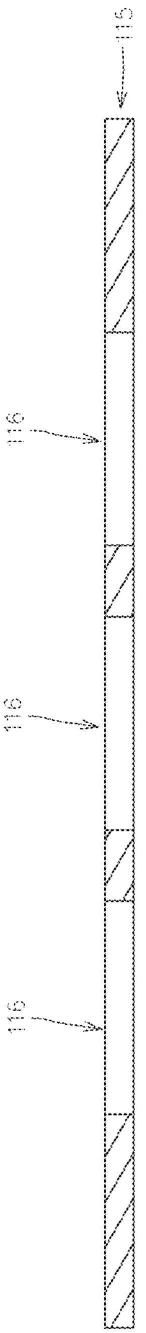
FIGS. 14*a* and 14B are cross-sectional views of a concave-portion-directed plate and a waveguide-directed plate, respectively, which are formed by a supporting plate forming step in a manufacturing method of the ultrasonic transducer according to the modified example of the first aspect.
Figure 14B:
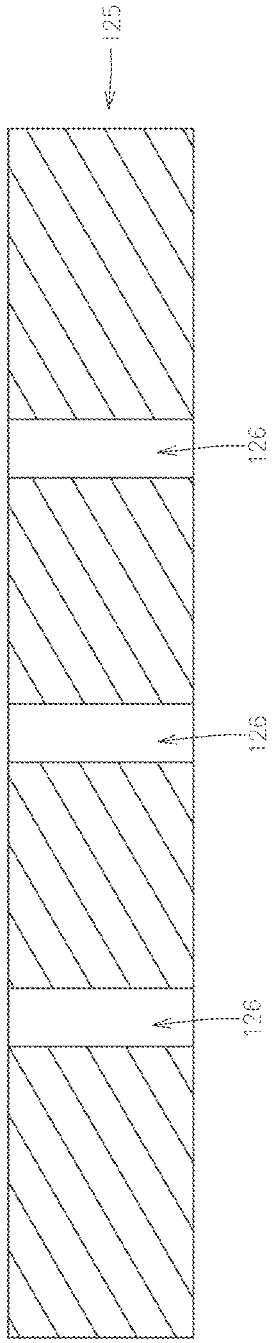
Figure 15:
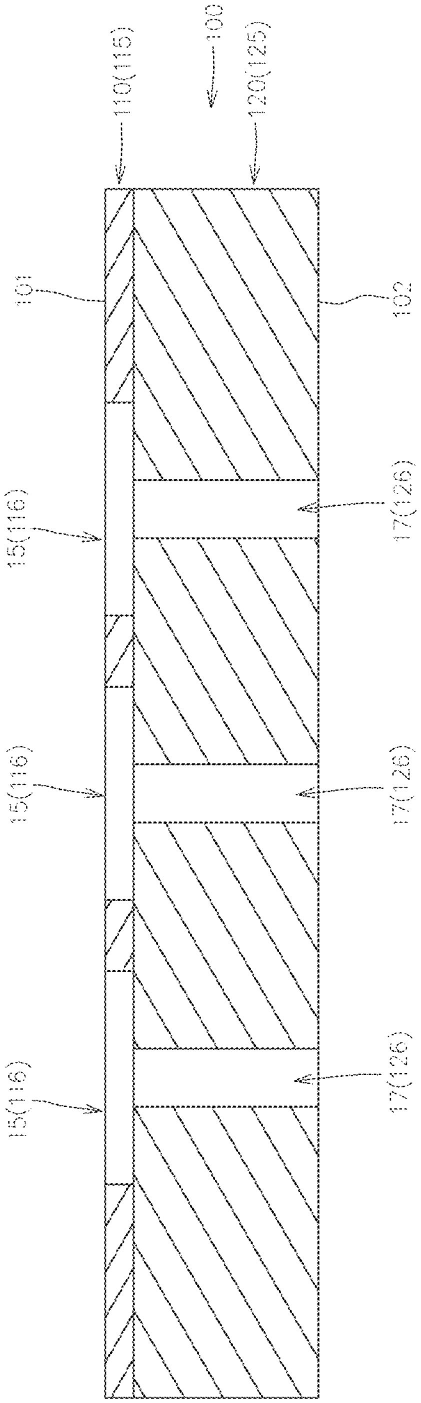
FIG. 15 is a cross-sectional view of a supporting plate of the ultrasonic transducer according to the modified example of the first aspect, the supporting plate being formed by fixing the concave-portion-directed plate and the waveguide-directed plate to each other shown in FIGS. 14A and 14B, respectively.

In a case where, in place of the supporting plate 10, the supporting plate 100 having the first and second plate bodies 110, 120 is provided, the supporting plate forming step is configured to include a process (FIG. 14A) of preparing a concave-portion-directed plate 115 that has a thickness same as the depth of the plurality of concave portions 15 and that is provided with a plurality of through holes 116 having opening widths same as the opening widths of the concave portions 15, a process (FIG. 14B) of preparing a waveguide-directed plate 125 that has a thickness same as the length of the plurality of waveguides 17 and that is provided with a plurality of through holes 126 having opening widths same as the opening widths of the waveguides 17, and a plate fixing process (FIG. 15) of forming the supporting plate 100 by fixing the concave-portion-directed plate 115 and the waveguide-directed plate 125 to each other by adhesive such as epoxy adhesive.

The process of preparing the waveguide-directed plate 125 is configured to inject ceramics material into a waveguide-plate-directed die that has a mold depth same as the length of the plurality of waveguides 17 and that is provided with a structure for forming a plurality of through holes having opening widths same as the opening widths of the plurality of the waveguides 17, respectively, and then bake the ceramics material.

The process of preparing the concave-portion-directed plate 115 is configured to prepare a metal plate such as SUS 304 having a thickness same as the depth of the plurality of concave portions 15, and then etch the metal plate so as to form a plurality of through holes having opening widths same as those of the concave portions 15, respectively.

Alternatively, the process of preparing the concave-portion-directed plate 115 is configured to inject ceramics material into a concave-portion-directed die that has a mold depth same as the length of the plurality of concave portions 15 and that is provided with a structure for forming a plurality of through holes having opening widths same as those of the plurality of the concave portions 15, respectively, and then bake the ceramics material.

Figure 16:
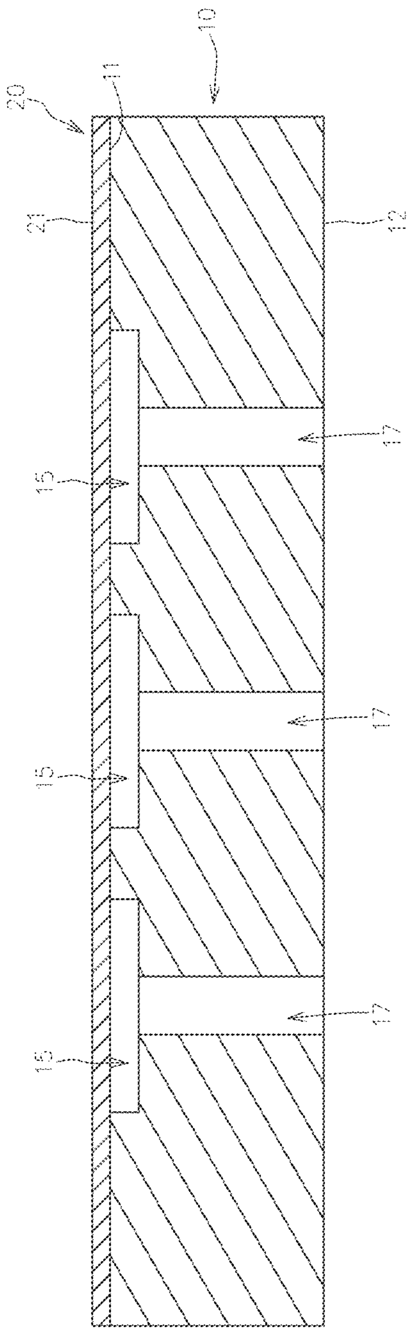
FIG. 16 is a cross-sectional view showing a state after a flexible resin film fixing step in the manufacturing method.
Figure 17:
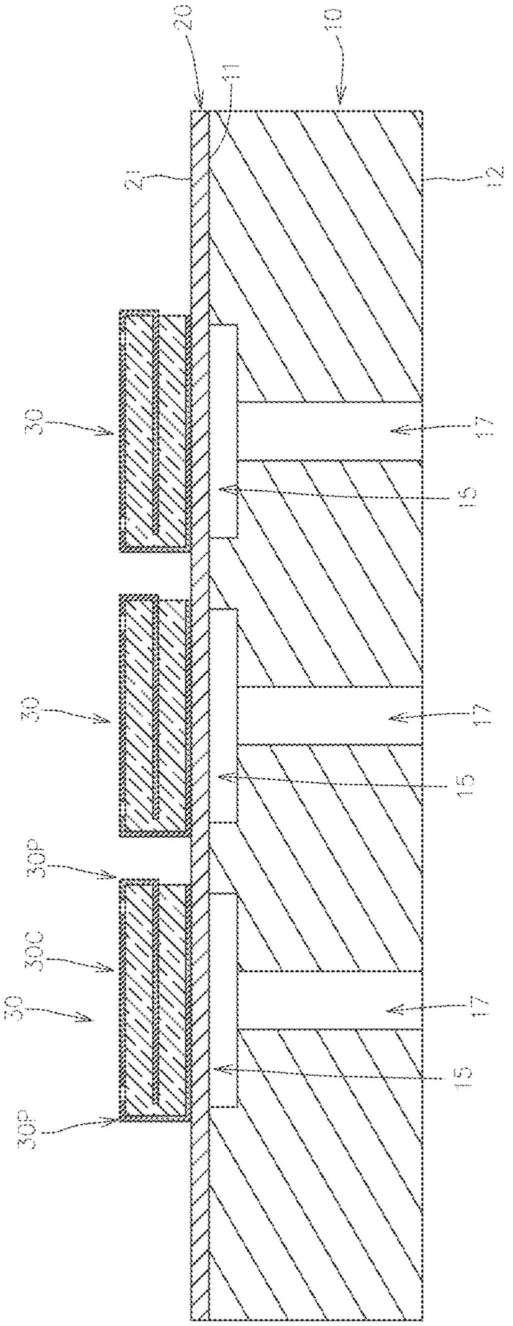
FIG. 17 is a cross-sectional view showing a state after a piezoelectric element fixing step in the manufacturing method.
Figure 18:
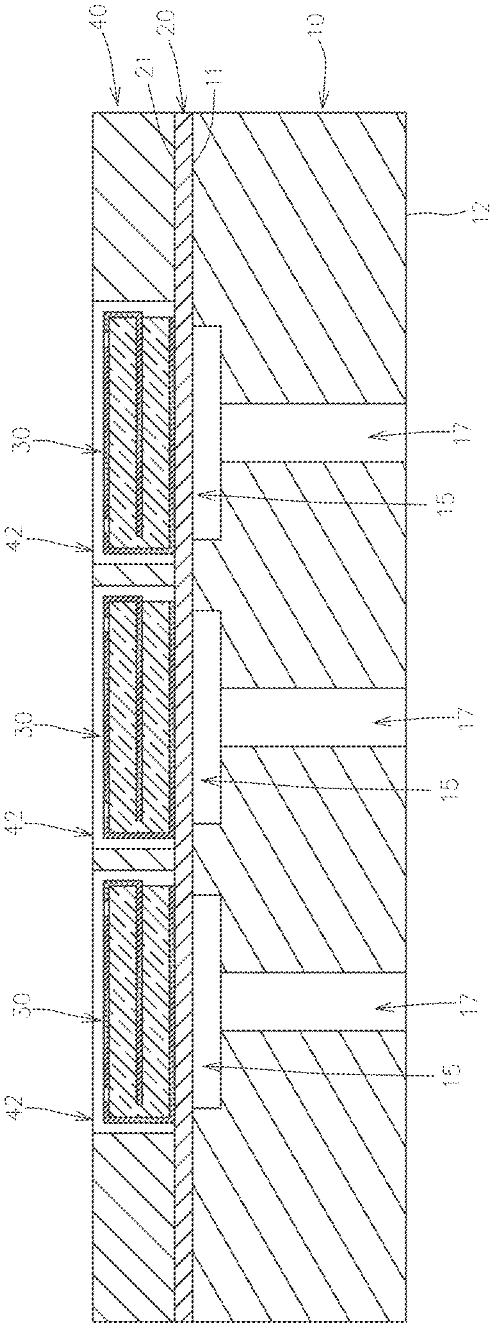
FIG. 18 is a cross-sectional view showing a state after a lower sealing plate arranging step in the manufacturing method.
Figure 19:
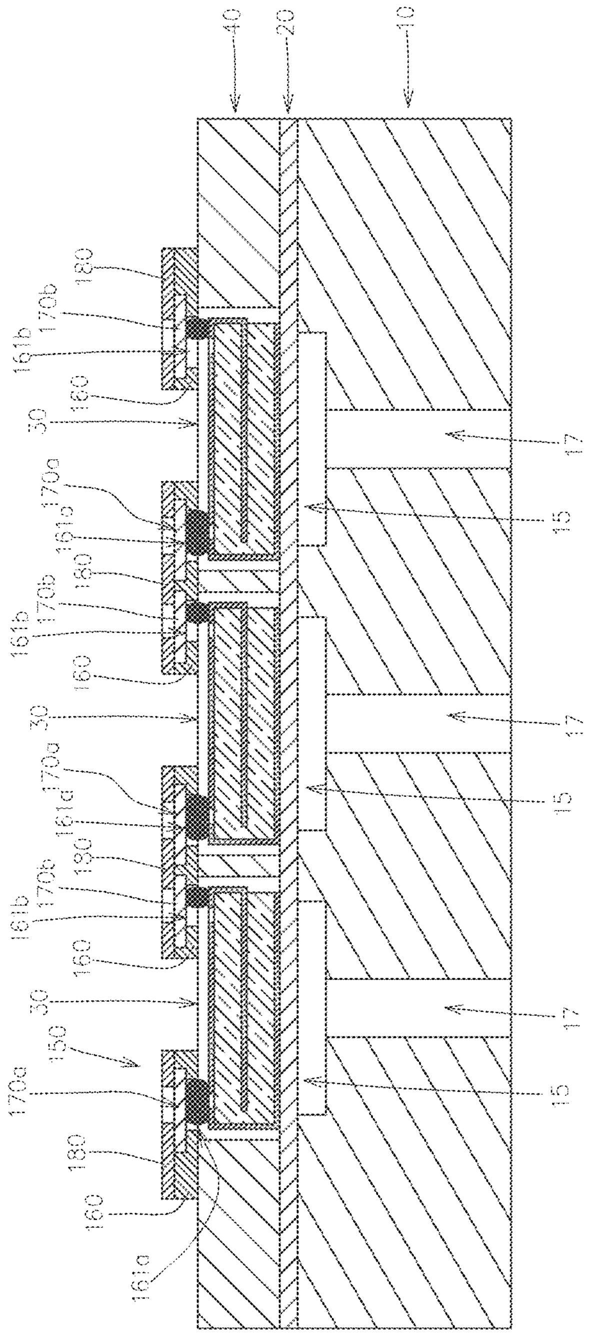
FIG. 19 is a cross-sectional view showing a state after an electric connection step in the manufacturing method.

The manufacturing method includes a flexible resin film fixing step (FIG. 16) of fixing the flexible resin film 20 to the first surface 11 of the supporting plate 10 by an adhesive or by thermocompression bonding to cover the plurality of concave portions 15, a piezoelectric element fixing step (FIG. 17) of fixing the plurality of piezoelectric elements 30 to the first surface 21 of the flexible resin film 20 by an insulative adhesive in such a manner that the center regions 30C (FIG. 2) overlap with the corresponding concave portions 15 and the peripheral regions 30P (FIG. 2) overlap with the supporting plate 10 (110) in a plan view, a lower sealing plate arranging step (FIG. 18) of preparing the lower sealing plate 40 having the plurality of piezoelectric-element-directed openings 42, and then fixing the lower sealing plate 40 to the first surface of the flexible resin film 20 by an adhesive so that the plurality of piezoelectric elements 30 are arranged within the plurality of piezoelectric-element-directed openings 42 in a plan view, a wiring assembly preparation step of preparing the wiring assembly 150 that includes the insulating base layer 160, the conductor layer 170 arranged on the base layer 16, and the insulating cover layer 180 enclosing the conductor layer 170, the conductor layer 170 including the first and second wirings 170*a*, 170*b*, the base layer 160 being formed with the first and second wiring/piezoelectric element connection openings 161*a*, 161*b* for exposing parts of the first and second wirings 170*a*, 170*b*, respectively, a wiring assembly fixing step of fixing the base layer 160 to the first surface of the lower sealing plate 40 by an adhesive such as a silicone adhesive, and an electric connection step (FIG. 19) of electrically connecting the portion of the first wiring 170 that is exposed through the first wiring/piezoelectric element connection opening 161*a* and the portion of the second wiring 170*b* that is exposed through the second wiring/piezoelectric element connection opening 161*b* to the first and second electrodes of the corresponding piezoelectric element 30, respectively.

Preferably, the manufacturing method may include a joining step in which the wiring assembly fixing step and the electric connection step are collectively performed at the same time.

The joining step includes a process of applying a thermosetting insulating adhesive to a portion of the first surface of the lower sealing plate 40 where the wiring assembly 150 is located, a process of applying a thermosetting conductive adhesive to an electrical connecting region of the first electrode of the piezoelectric element 30 (so as to extend across a part of the top surface electrode 36 and the bottom surface electrode terminal 37T of the piezoelectric element 30 in the present aspect (see FIG. 5)), a process of applying a thermosetting conductive adhesive to an electrical connecting region (the inner electrode terminal 34T in the present aspect (see FIG. 5) of the second electrode of the piezoelectric element 30, a process of forming a preassembly by arranging the wiring assembly 150 at a predetermined position on the first surface of the lower sealing plate 40, and a process of curing the thermosetting insulating adhesive and the thermosetting conductive adhesive by heating and treating the preassembly at about 120° C. to 150° C. during several tens of minutes, for example.

With the joining step, it is possible to fix the wiring assembly 150 to the lower sealing plate 40 and electrically connect the wiring assembly 150 with the piezoelectric element 30 at the same time, so that the efficiency can be improved.

Needless to say, the electric connection step may be performed after the wiring assembly fixing step.

Figure 20:
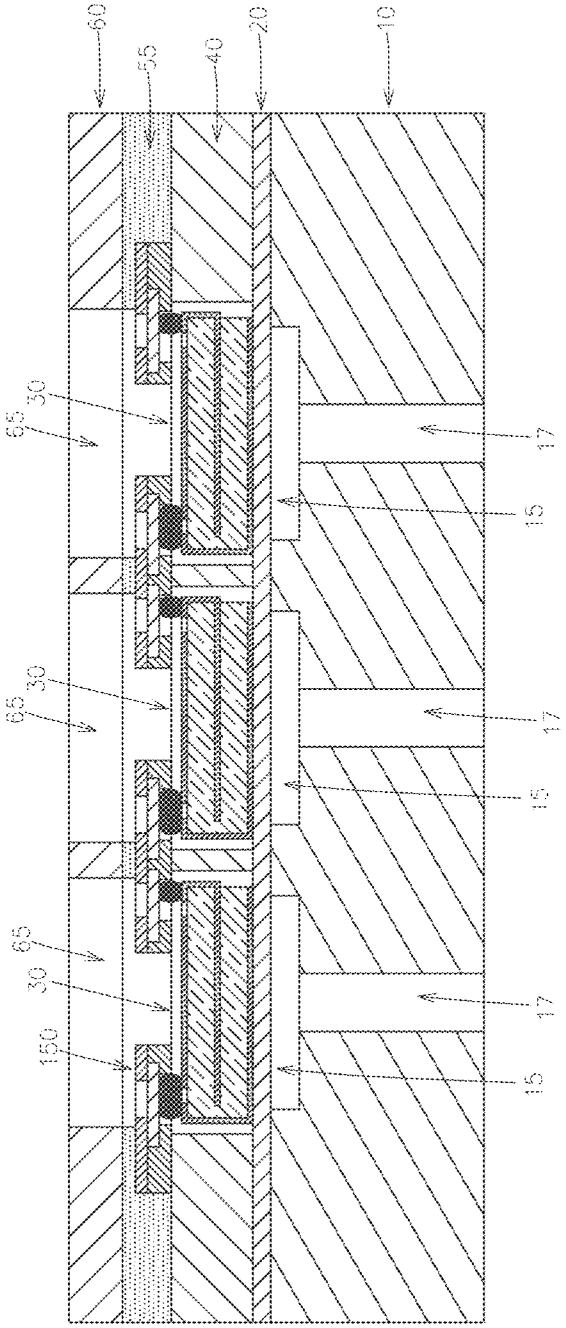
FIG. 20 is a cross-sectional view showing a state after an upper sealing plate arranging step in the manufacturing method.

The manufacturing method further includes, after the electric connection step, an upper sealing plate arranging step (FIG. 20) of arranging the upper sealing plate 60.

The upper sealing plate arranging step includes a process of applying a thermosetting type flexible resin 55 such as a silicone resin to the top surface of the wiring assembly 150, a process of arranging the upper sealing plate 60 on the flexible resin, and a process of curing the flexible resin 55 by heating the flexible resin at about 100° C. to 150° C. during several tens of minutes, for example.

Figure 21:
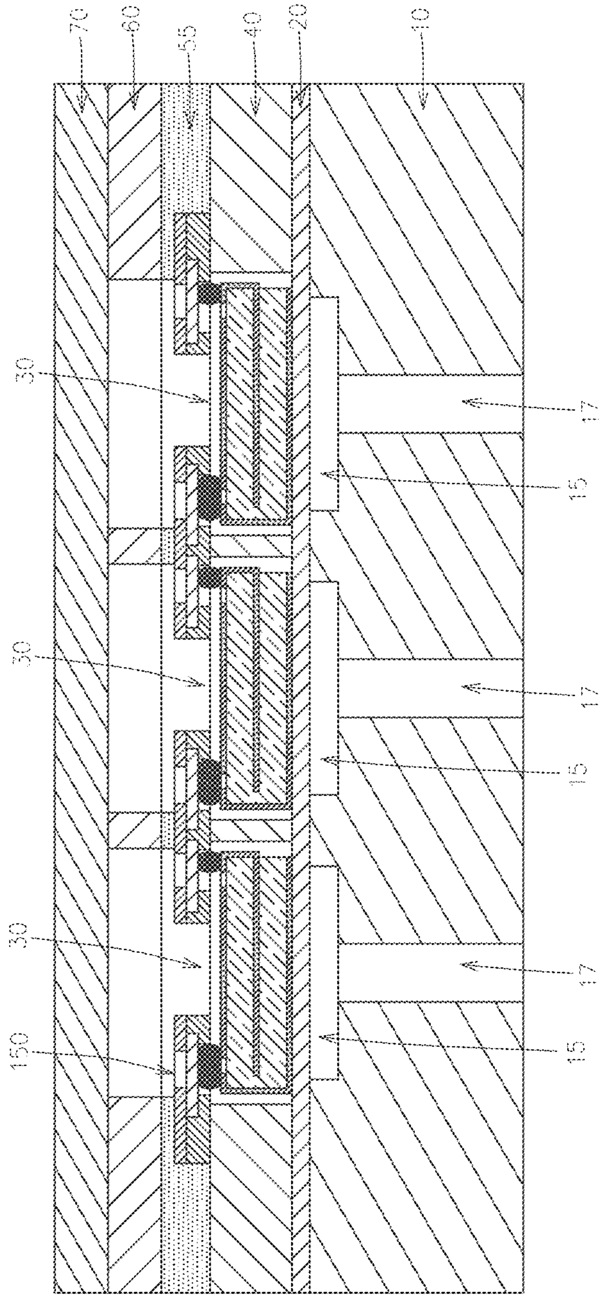
FIG. 21 is a cross-sectional view showing a state after a sound absorbing material arranging step in the manufacturing method.
Figure 22:
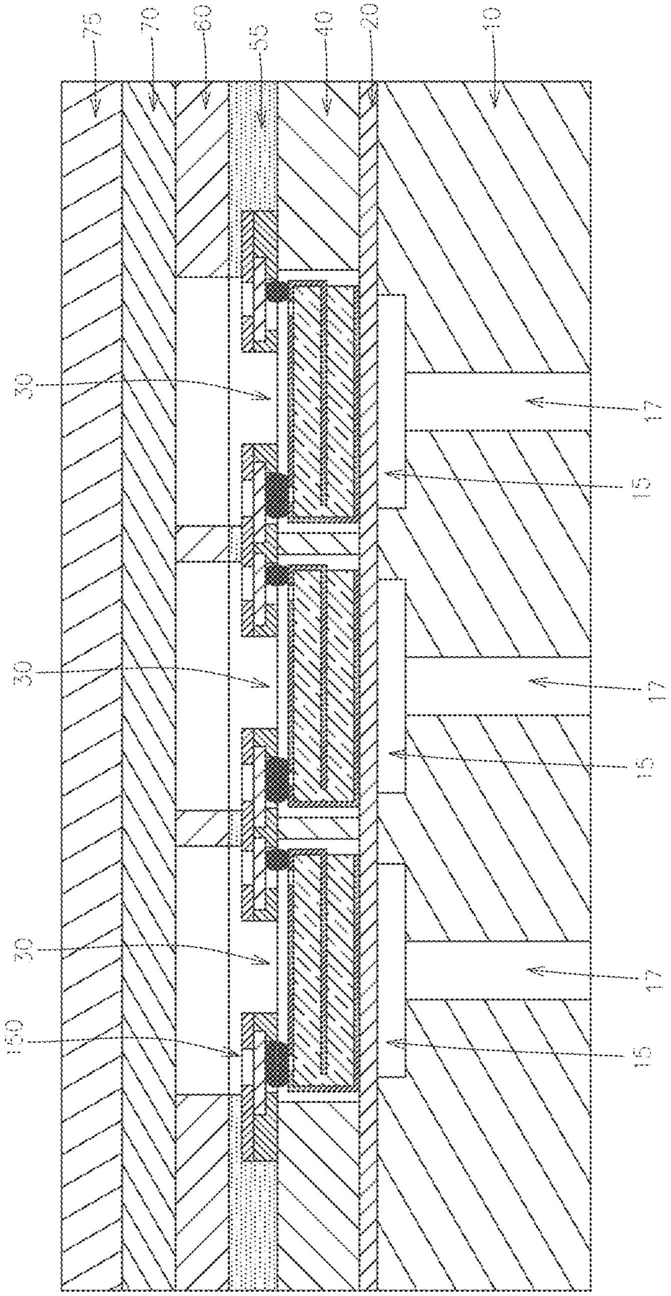
FIG. 22 is a cross-sectional view showing a state after a reinforcing plate arranging step in the manufacturing method.

The manufacturing method further includes, after the upper sealing plate arranging step, a step (FIG. 21) of arranging the sound absorbing material 70 and a step (FIG. 22) of arranging the reinforcing plate 75.

The sound absorbing material arranging step includes a process of applying a thermosetting insulating adhesive to the top surface of the upper sealing plate 60, a process of arranging the sound absorbing material 70 such as a silicone resin or another foamed resin on the thermosetting insulating adhesive, and a process of curing the thermosetting insulating adhesive by heating the thermosetting insulating adhesive at about 120° C. to 150° C. during several tens of minutes, for example.

The reinforcing plate arranging step includes a process of applying a thermosetting insulating adhesive to the top surface of the sound absorbing material 70, a process of arranging the reinforcing plate 75 on the thermosetting insulating adhesive, and a process of curing the thermosetting insulating adhesive by heating the thermosetting insulating adhesive at about 120° C. to 150° C. during several tens of minutes, for example.

Second Aspect

Another aspect of the ultrasonic transducer according to the present invention will be described below with reference to the accompanying drawings.

Figure 23:
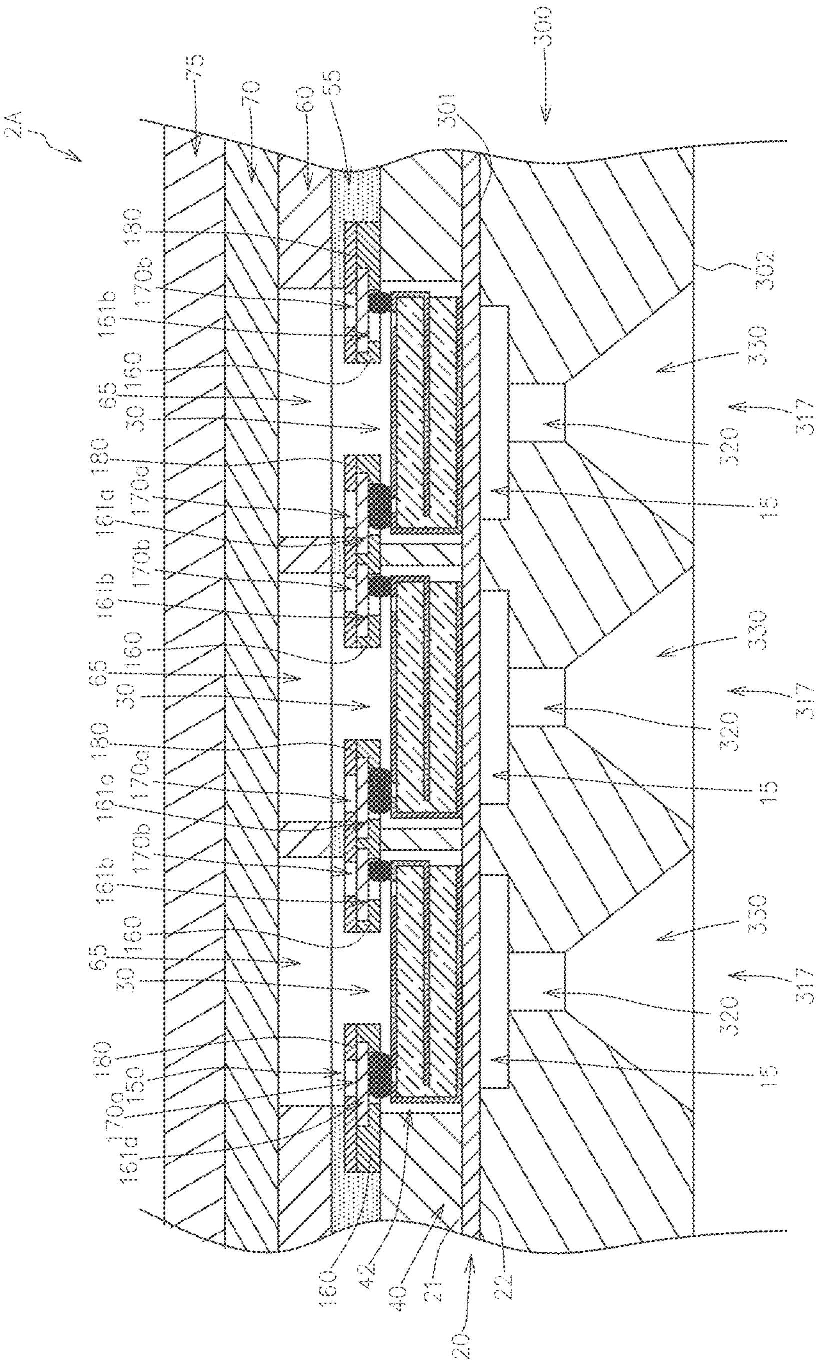
FIG. 23 is a vertical cross-sectional view of a part of an ultrasonic transducer according to a second aspect of the present disclosure.

FIG. 23 illustrates a vertical cross-sectional view of a part of an ultrasonic transducer 2A according to the present aspect.

In the drawings, the same reference numerals are applied to the same components as those in the aspect 1 above, and the description thereof will be omitted as appropriate.

As shown in FIG. 23, the ultrasonic transducer 2A according to the present aspect includes a supporting plate 300 in place of the supporting plate 10.

Specifically, the ultrasonic transducer 2A includes, as main components, the rigid supporting plate 300 having first and second surfaces 301, 302 that are positioned on one and the other sides in a thickness direction, respectively; the flexible resin film 20 fixed to the first surface 301 of the supporting plate 300; and the plurality of piezoelectric elements 30 fixed to the first surface 21 of the flexible resin film 20.

Figure 24:
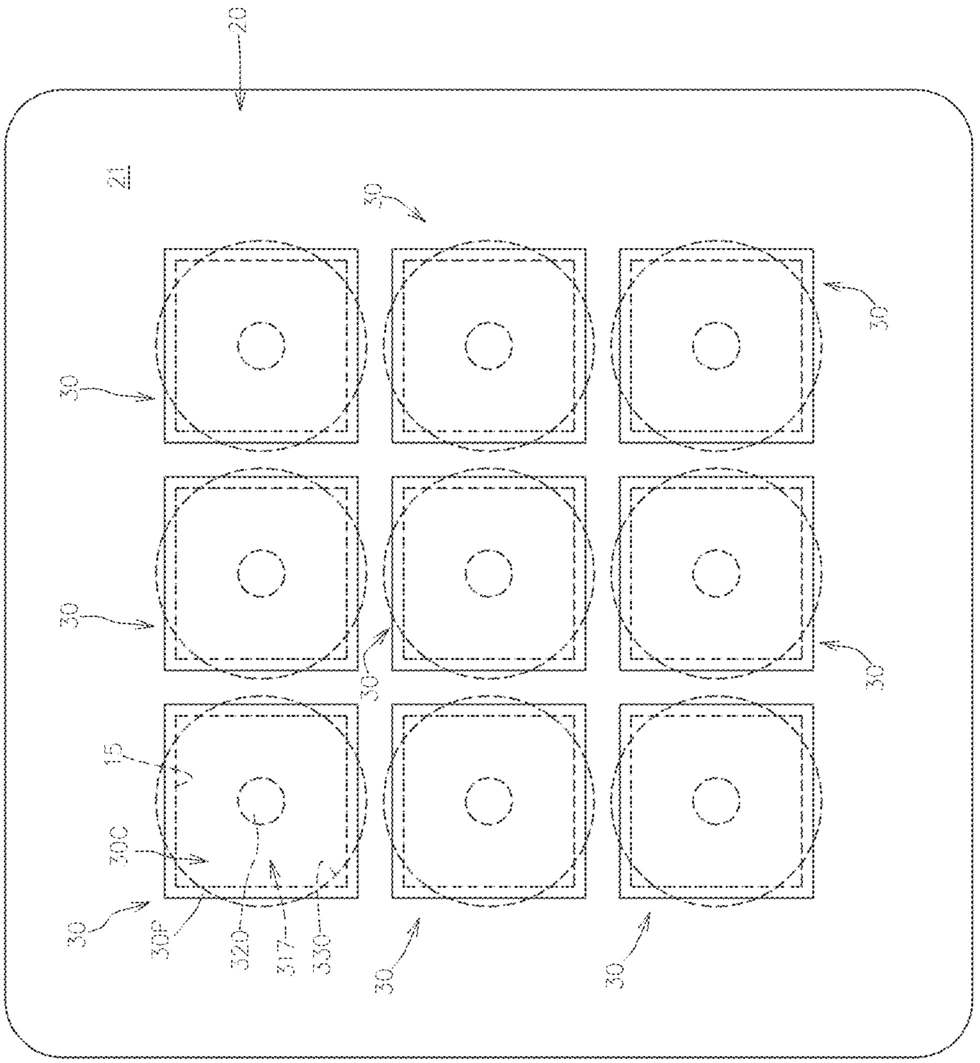
FIG. 24 is a plan view of a piezoelectric body assembly (a supporting plate, a flexible resin film and a plurality of piezoelectric elements) of the ultrasonic transducer according to the second aspect.

FIG. 24 illustrates a plan view of a piezoelectric body assembly including the supporting plate 300, the flexible resin film and the plurality of piezoelectric elements 30.

The supporting plate 300 is different from the supporting plate 10 in that the waveguides 17 are replaced by waveguides 317.

Specifically, as shown in FIGS. 23 and 24, the supporting plate 300 is provided with the plurality of concave portions 15 and the plurality of waveguides 17 having first end portions that are respectively opened to bottom surfaces of the plurality of concave portions 15 and second end portions that are opened to the second surface 302 of the supporting plate 300.

The waveguide 317 includes a tubular part 320 opened to the bottom surface of the concave portion 15 and a horn part 330 opened to the second surface of the supporting plate 300.

As shown in FIGS. 23 and 24, the tubular part 320 is formed to be a tubular shape having an opening width that is smaller than that of the concave portion 15 and that is uniform over the thickness direction.

On the other hand, the horn part 330 is formed to have a horn shape having an opening width that is increased as being close to the end portion (sound wave radiation opening) opened to the second surface 302 of the supporting plate 300 from the end portion connected to the tubular part 320 in a thickness direction.

The thus configured ultrasonic transducer 2A makes it possible to increase the sound pressure lever of the sound wave that is emitted by the vibrating body formed by the piezoelectric elements 30 and the flexible resin film 20.

As similar to the first aspect, the supporting plate 300 can be replaced by a supporting plate 350 in which a portion (a first plate body 360 explained below) where the concave portions 15 are formed and a portion (a second plate body 370 explained below) where the waveguides 317 are formed are separate from each other.

Figure 25:
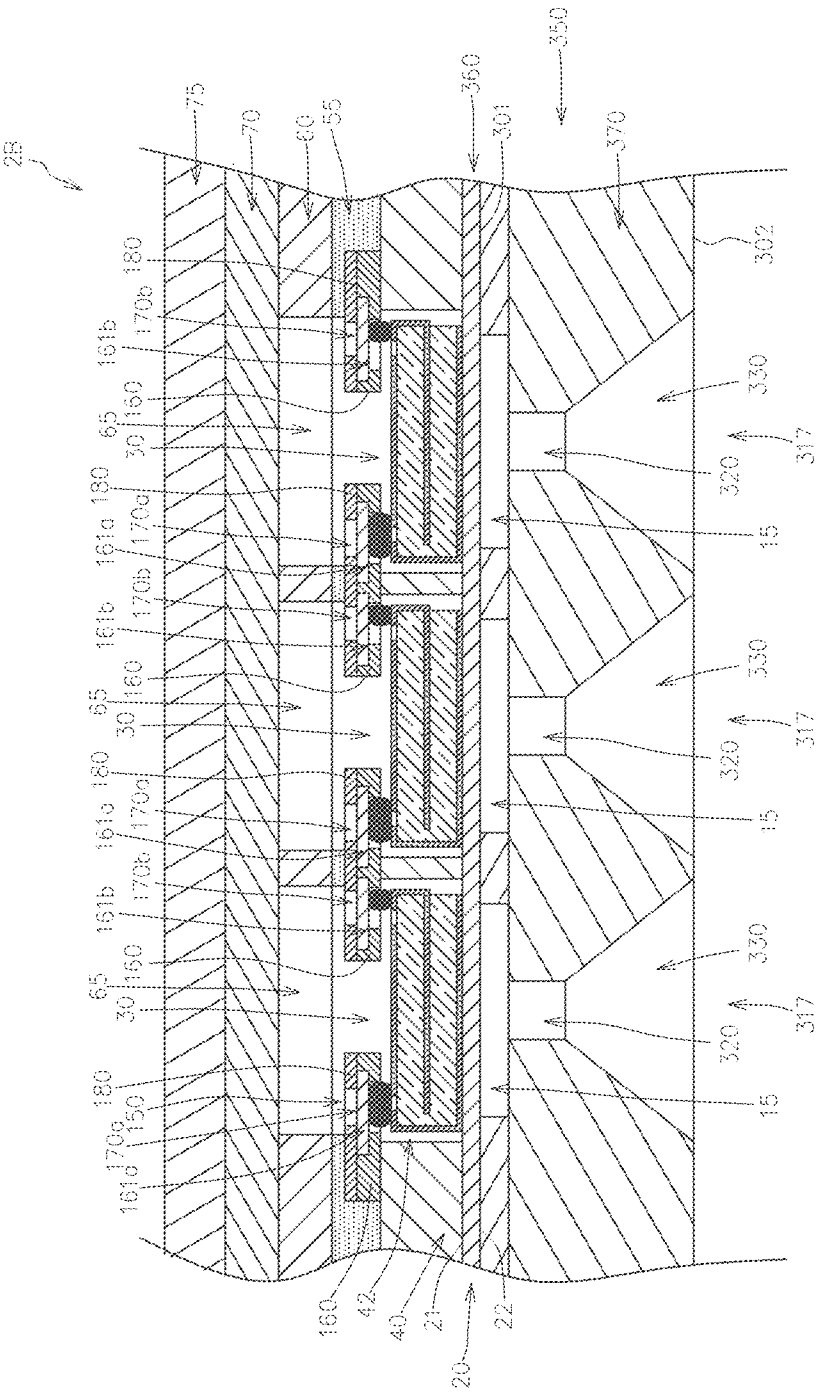
FIG. 25 is a vertical cross-sectional view of a part of an ultrasonic transducer according to a modified example of the second aspect.

FIG. 25 illustrates a vertical cross-sectional view of a part of an ultrasonic transducer 2B with the supporting plate 350 according to a modified example of the present aspect.

Hereinafter, analyses that the inventor of the present invention performed for examples of the present aspect are explained.

Analysis (5)

Figures 26A, 26B:
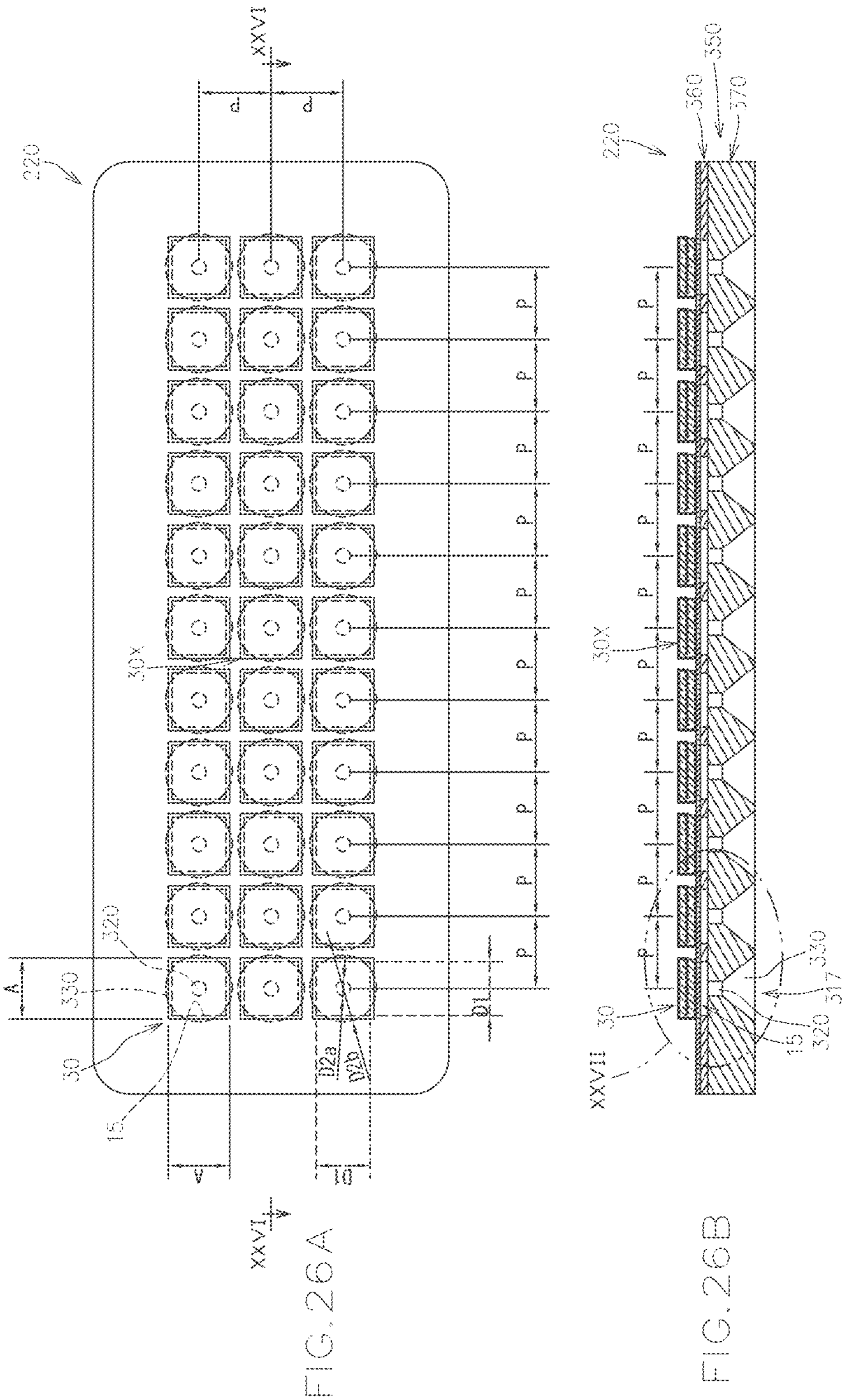
FIG. 26A is a plan view of a model (piezoelectric body assembly) of the second aspect on which finite element method (FEM) analyses are performed.
FIG. 26B is a cross-sectional view taken along the line XXVI-XXVI in FIG. 26A.

FIG. 26A illustrates a plan view of a model (piezoelectric body assembly) 220 used in this analysis.

FIG. 26B illustrates a cross sectional view taken along the line XXVI-XXVI in FIG. 26A.

Figure 27:
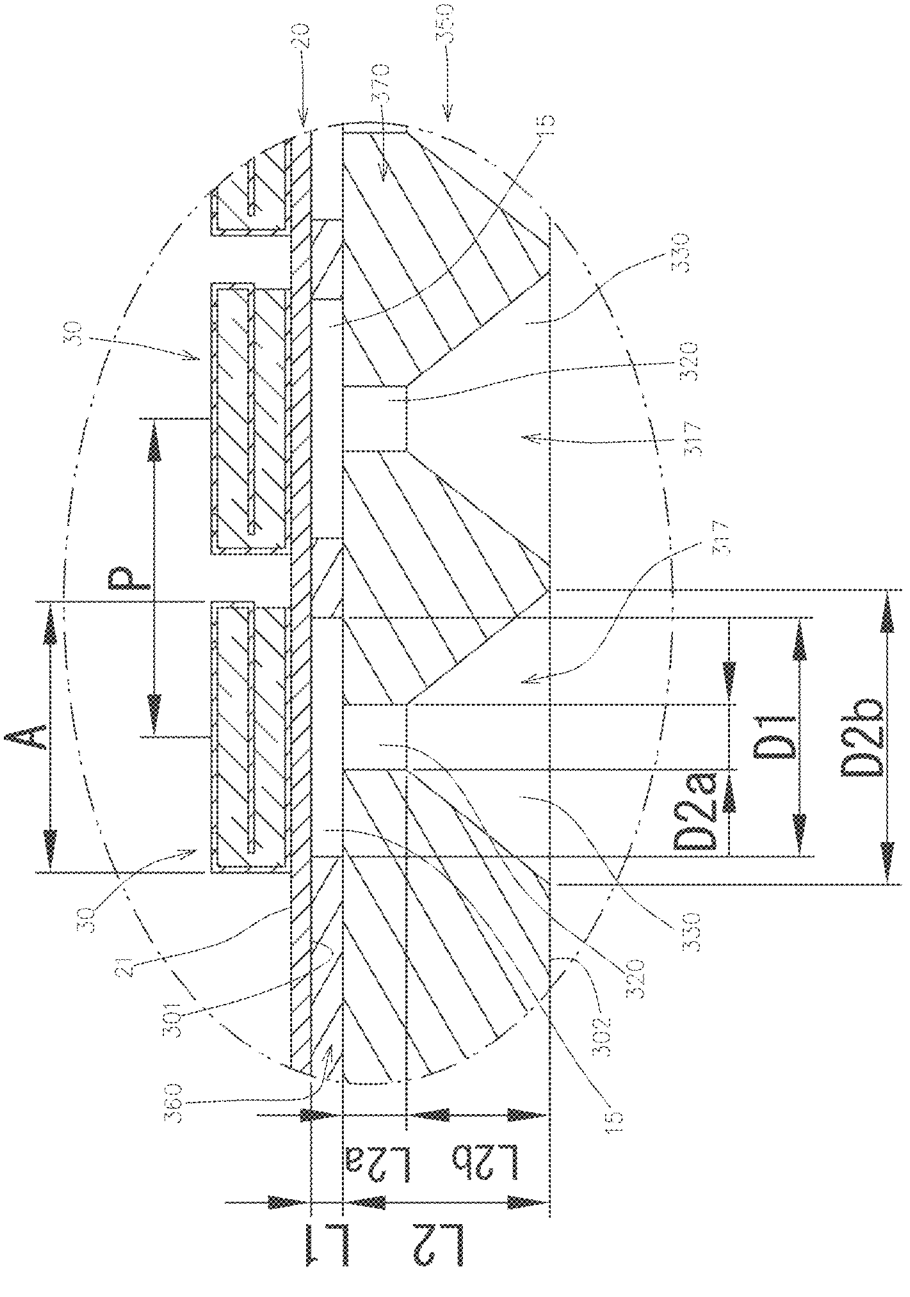
FIG. 27 is an enlarged view of a part XXVII in FIG. 26B

FIG. 27 is an enlarged view of a part XXVII in FIG. 26B.

As shown in FIGS. 26A, 26B and 27, the model 220 has the supporting plate 350 including the first and second plate bodies 360, 370, the flexible resin film 20 fixed to the first surface 301 of the supporting plate 350, and the thirty-three piezoelectric elements 30 in a 11×3 arrangement fixed to the first surface 21 of the flexible resin film 20.

The analysis (5) is for obtaining a relationship between the opening width D2a of the tubular part 320 and the sound pressure level of the radiation sound wave emitted by the vibrating body by using the finite element method analysis, in the model 220 formed with the waveguide 317 that includes the tubular part 320 having the opening width that is uniform over the thickness direction and the horn part 330 having the opening width that is increased as being close to the sound wave radiation opening opened to the second surface 302 of the supporting plate 350 in a thickness direction.

In the analysis (5), in a case where only a piezoelectric element 30X (see FIG. 26A) positioned at a center among the thirty-three piezoelectric elements in a 3×11 arrangement of the model 220 is driven by a sine wave voltage having an amplitude of 10 V and a frequency of 40 kHz, a sound pressure distribution was calculated at a position away from the vibrating body including the piezoelectric element 30X by a distance of 0.3 meters on an imaginary vertical line that passes a center of the vibrating body including the piezoelectric element 30X and that is perpendicular to a plane on which the model 220 is arranged.

In the analysis (5), a shape and a size of the piezoelectric element 30, a material and a thickness of the flexible resin film 20, an opening width D1 of the concave portion 15, a thickness L1 of a portion (the first plate body 360) where the concave portions 15 were formed, and an arrangement pitch P of the piezoelectric elements 30 were set to be as follows.

| | |
|---|---|
| Piezoelectric element 30: | Two-layer laminated type, thickness of one layer 0.13 mm (total thickness of 0.26 mm) Square shape in a plan view having one side length of A = 3.4 mm × 3.4 mm |
| Flexible resin film 20: | polyimide film having a thickness of 0.05 mm |
| Thickness of portion (first plate body 360) where the concave portions 15 were formed: | L1 = 0.1 mm |
| Concave portion 15: | Square shape in a plan view having the opening width D1 = 3.3 mm |
| Waveguide: | Square shape in a plan view having the opening width D2 = 2.2 mm |

-continued

| | |
|---|---|
| Arrangement pitch: | P = 4.0 mm |
| Thickness of portion (second plate body 370) where the waveguides 317 were formed: | L2 = 3.0 mm |
| Diameter of sound wave radiation opening: | Circular shape in a plan view having opening width D2b = 3.7 mm |
| Arrangement pitch: | P = 4.0 mm |

The material of the portion (the first plate body 360) where the concave portions 15 were formed was set to SUS 304, and the material of the portion (the second plate body 370) where the waveguides 317 were formed was set to Sic.

The diameter D2b of the sound wave radiation opening was set to 3.7 mm taking into account that it is preferable to be as great as possible within a range not exceeding the arrangement pitch (P=4.0 mm) of the piezoelectric elements 30.

In examples 5-(1) to 5-(7) of the analysis (5), the opening width D2a is set to be as follows while keeping a length L2 of the tubular part 320 at a fixed value (0.25 mm).

Example 5-(1): D2a=1.2 mm

Example 5-(2): D2a=1.35 mm

Example 5-(3): D2a=1.5 mm

Example 5-(4): D2a=1.65 mm

Example 5-(5): D2a=1.8 mm

Example 5-(6): D2a=2.2 mm

Example 5-(7): D2a=2.5 mm

As a reference example, with respect to the model 210 (FIGS. 10A and 10B) with the waveguides having an opening width that is constant over the thickness direction, a relationship between the opening width D2 of the waveguide 17 and the sound pressure level of the radiation sound wave emitted by the vibrating body by using the finite element method analysis.

In the reference examples 5-(1) to 5-(7), the opening width D is set to be as follows while setting other conditions to be same as those in the examples 5-(1) to 5-(7).

Reference example 5-(1): D2=1.2 mm

Reference example 5-(2): D2=1.5 mm

Reference example 5-(3): D2=1.8 mm

Reference example 5-(4): D2=2.2 mm

Reference example 5-(5): D2=2.5 mm

Figure 28:
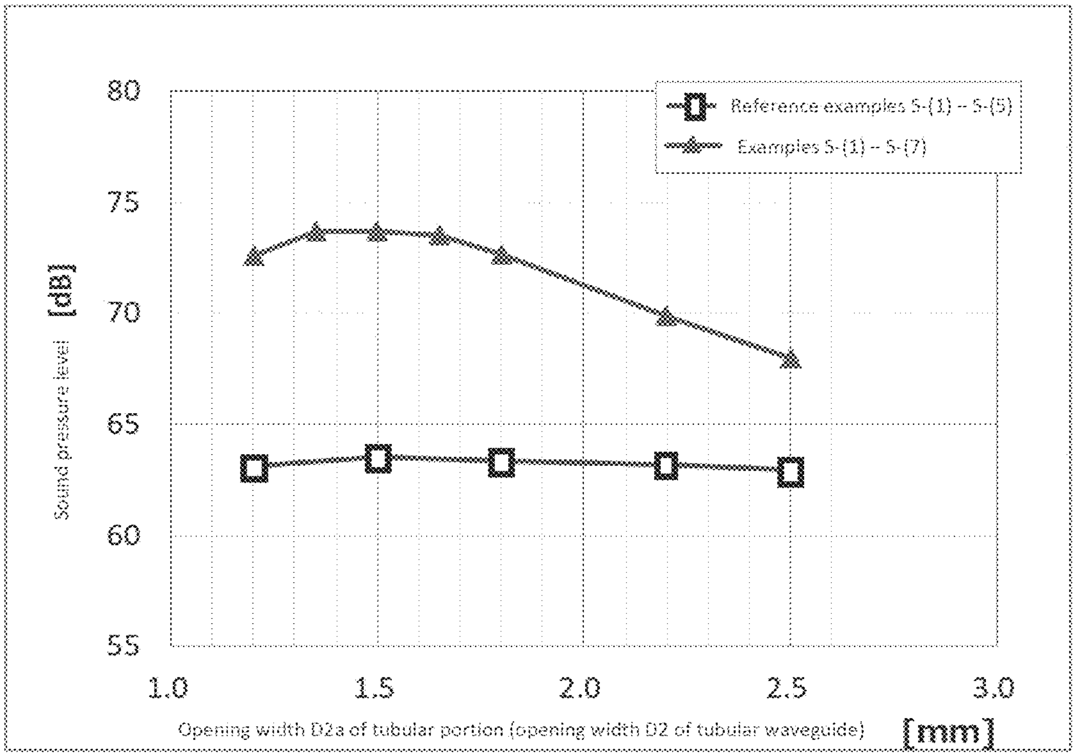
FIG. 28 is a graph showing a result of the finite element method analysis performed on the model shown in FIGS. 26A and 26B for a relationship between an opening width D2a of a tubular part of a waveguide and a sound pressure level of a radiation sound wave emitted by the vibrating body including the piezoelectric element.

The result of the analysis (5) is shown in FIG. 28.

As apparent from FIG. 28, the configuration (the examples 5-(1) to 5-(7)) with the waveguide 317 including the horn part 330 has the sound pressure level remarkably higher than the configuration (the reference examples 5-(1) to 5(4)) with the tubular waveguide 17 having the opening width that is constant over the thickness direction.

As also apparent from FIG. 8, the configuration (the examples 5-(1) to 5-(7)) with the waveguide 317 including the horn part 330 realizes a maximum sound pressure level in a case where the opening width D2 is set to 1.35 mm-1.65 mm (that is, in a case where D2a/λ that is a ratio of the opening width D2a of the tubular part 320 to the wavelength λ (8.6 mm that is the wavelength of the ultrasonic wave having a frequency of 40 kHz) of the sound wave emitted by the vibrating body including the piezoelectric element 30.

Analysis (6)

In the analysis (6), a relationship between a length L2a (see FIG. 27) of the tubular part 320 and the sound pressure level in the model 220 shown in FIGS. 26A, 26B and 27 was calculated by using a finite element method (FEM) analysis.

In examples 6-(1) to 6-(4) of the analysis (6), the length L2a of the tubular part 320 is set to be as follows while keeping the opening width D2a at a fixed value (1.5 mm).

Other conditions were set to be same as those in the analysis (5).

Example 6-(1): L2a=0.15 mm (that is, L2b=2.85 mm)

Example 6-(2): L2a=0.25 mm (that is, L2b=2.75 mm)

Example 6-(3): L2a=0.75 mm (that is, L2b=2.15 mm)

Example 6-(4): L2a=1.2 mm (that is, L2b=1.8 mm)

Also in the analysis (6), in a manner similar to the analysis (5), in a case where only the piezoelectric element 30X (see FIG. 26A) positioned at a center in the model 220 is driven by the sine wave voltage having an amplitude of 10 V and a frequency of 40 kHz, the sound pressure distribution was calculated at a position away from the vibrating body including the piezoelectric element 30X by a distance of 0.3 meters on an imaginary vertical line that passes a center of the vibrating body including the piezoelectric element 30X and that is perpendicular to a plane on which the model 220 is arranged.

Figure 29:
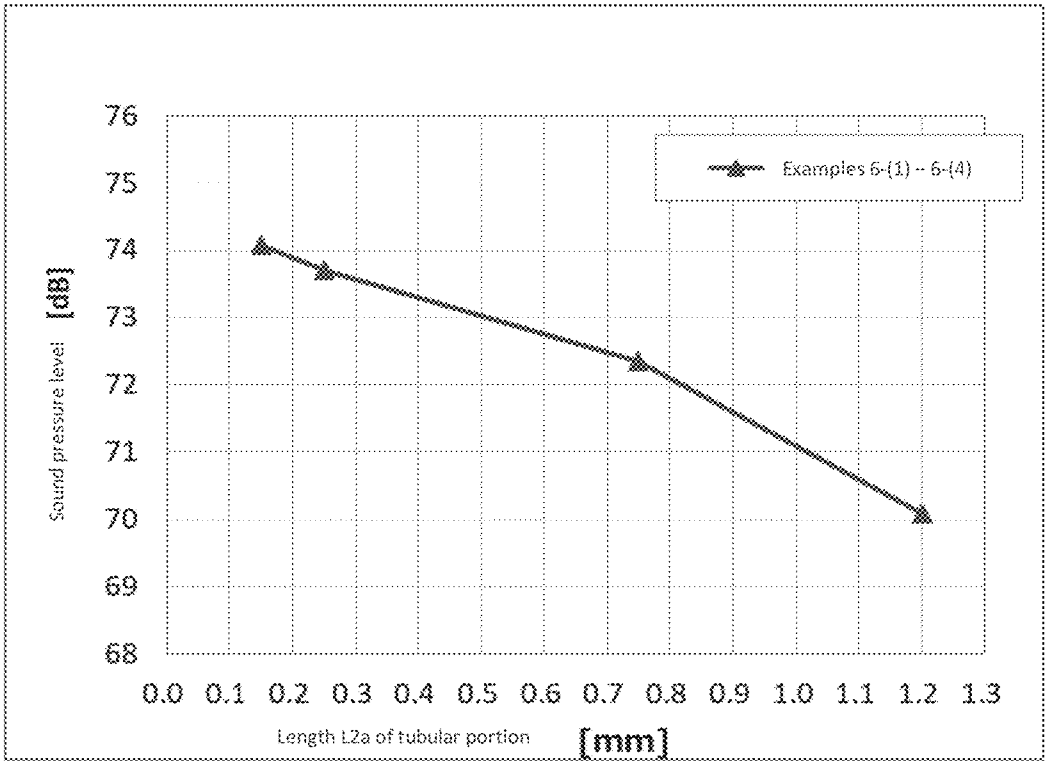
FIG. 29 is a graph showing a result of the finite element method analysis performed on the model shown in FIGS. 26A and 26B for a relationship between a length L2a of the tubular part and the sound pressure level.

The result of the analysis (6) is shown in FIG. 29.

As apparent from FIG. 29, the sound pressure level is increased as the length L2a of the tubular part 320 becomes shorter (that is, as the length L2b of the horn part 330 becomes longer).

It is preferable to set the length L2a of the tubular part 320 to be less than or equal to 0.75 mm (that is, it is preferable to set L2a/λ, that is a ratio of L2a to the wavelength λ (wavelength of 8.0 mm in driving frequency of 40 kHz) of the sonic wave emitted by the vibrating body including the piezoelectric element 30 to be less than or equal to 0.09), and is more preferable to set L2a to be less than or equal to 0.3 mm (that is, it is more preferable to set to be L2a/L<0.05).

Analysis (7)

In the analysis (7), a relationship between the diameter of sound wave radiation opening (see FIG. 27) and the sound pressure level in the model 220 shown in FIGS. 26A, 26B and 27 was calculated by using a finite element method (FEM) analysis.

In examples 7-(1) to 7-(4) of the analysis (7), the diameter of sound wave radiation opening D2b is set to be as follows while keeping the length L2a and the opening width D2a of the tubular part 320 at respective fixed values (L2a=0.25 mm and D2a=1.5 mm).

Other conditions were set to be same as those in the analysis (5).

Example 7-(1): D2b=1.5 mm

Example 7-(2): D2b=2.0 mm

Example 7-(3): D2b=3.0 mm

Example 7-(4): D2b=3.7 mm

The example 7-(1) is configured so that the diameter of sound wave radiation opening D2b is same as the opening width D2a of the tubular part 320, and, that is, has a configuration of the model 210 with the tubular waveguides 17, which is shown in FIG. 10.

Also in the analysis (7), in a manner similar to the analyses (5) and (6), in a case where only the piezoelectric element 30X (see FIG. 26A) positioned at a center in the model 220 is driven by the sine wave voltage having an amplitude of 10 V and a frequency of 40 kHz, the sound pressure distribution was calculated at a position away from the vibrating body including the piezoelectric element 30X by a distance of 0.3 meters on an imaginary vertical line that passes a center of the vibrating body including the piezoelectric element 30X and that is perpendicular to a plane on which the model 220 is arranged.

Figure 30:
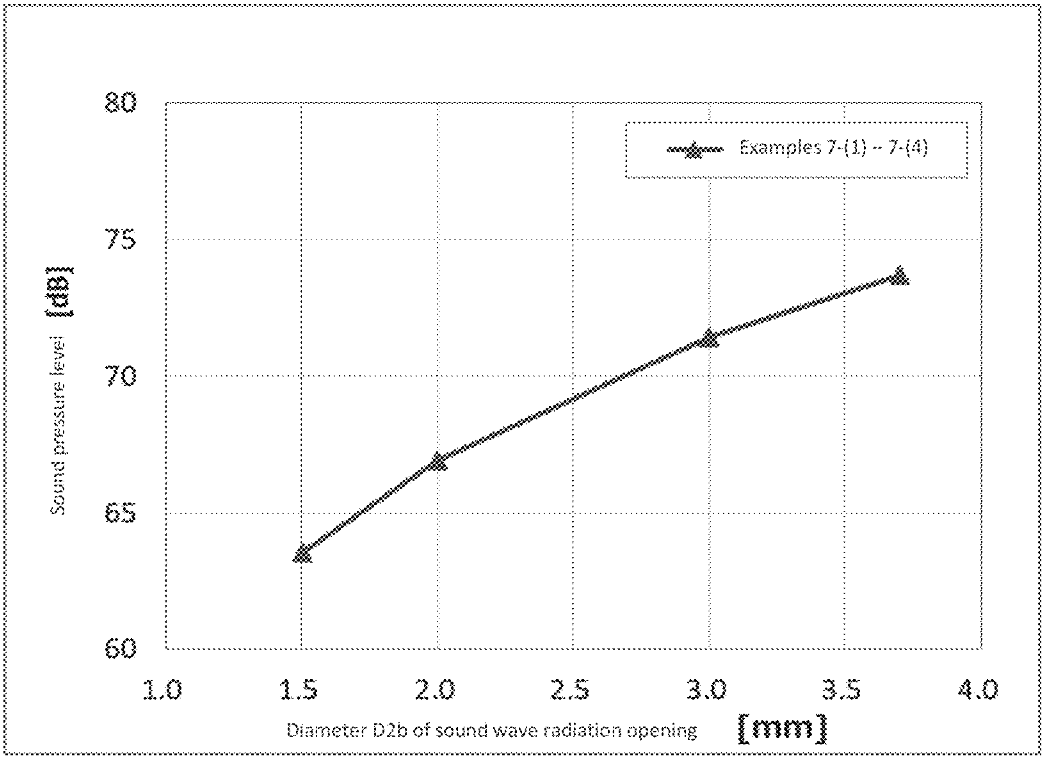
FIG. 30 is a graph showing a result of the finite element method analysis performed on the model shown in FIGS. 26A and 26B for a relationship between a diameter D2b of a sound wave radiation opening and the sound pressure level.

The result of the analysis (7) is shown in FIG. 30.

As apparent from FIG. 30, the sound pressure level is increased as the diameter of sound wave radiation opening D2b is enlarged.

However, since the diameter of sound wave radiation opening D2b cannot be enlarged greater than the arrangement pitch P of the piezoelectric elements 30, it is preferable to set the ratio of the diameter of sound wave radiation opening D2b to the arrangement pitch P to 0.8-0.95.

Specifically, in a case where the arrangement pitch P is 4.0 mm, it is preferable to set the diameter of sound wave radiation opening D2b to 3.2 mm-3.8 mm.

DESCRIPTION OF THE REFERENCE NUMERALS

1A-1B, 2A-2B ultrasonic transducer
10, 100, 300, 35 supporting plate
11, 301 first surface of supporting plate
12, 302 second surface of supporting plate
15 concave portion
17 waveguide
20 flexible resin film
30 piezoelectric element
30C center region in a plan view of the piezoelectric element
30P peripheral region in a plan view of the piezoelectric element
40 lower sealing plate
42 piezoelectric-element-directed opening
55 flexible resin
60 upper sealing plate
65 opening part of upper sealing plate
70 sound absorbing material
75 reinforcing plate
110, 360 first plate body
120, 370 second plate body
150 wiring assembly
160 base layer
161*a* first wiring/piezoelectric element connection opening
161*b* second wiring/piezoelectric element connection opening
170 conductor layer
170*a* first wiring
170*b* second wiring
317 waveguide
320 tubular part
330 horn part

The invention claimed is:

1. An ultrasonic transducer comprising:

a supporting plate having first and second surfaces on one side and another side in a thickness direction, the supporting plate being provided with a plurality of concave portions opened to the first surface, and a plurality of waveguides having first end portions on one side that are respectively opened to bottom surfaces of the plurality of concave portions and that have opening widths smaller than those of the corresponding concave portions and second end portions on another side that are opened to the second surface to form sound wave radiation openings;

a flexible resin film that is fixed to the first surface of the supporting plate to cover the plurality of concave portions; and the same number of piezoelectric elements as the plurality of concave portions that are fixed to a first surface of the flexible resin film so that their center regions overlap, in a plan view, with the corresponding plurality of concave portions and their peripheral regions overlap, in a plan view, with the first surface of the supporting plate, wherein a vibrating body formed by the piezoelectric element and the flexible resin film has a resonance frequency of the lowest flexural vibration mode higher than a driving frequency of the piezoelectric element, and wherein the supporting plate is configured so that a resonance frequency of the lowest flexural vibration mode of the entire of the ultrasonic transducer is higher than the driving frequency of the piezoelectric element.

2. The ultrasonic transducer according to claim 1, wherein an arrangement pitch of the plurality of piezoelectric elements is equal to or less than 4.3 mm, wherein the piezoelectric element has a rectangular shape in the plan view having longitudinal and lateral dimensions in the plan view with a maximum value of 4.0 mm or less, a circular shape in the plan view having a diameter of 4.0 mm or less, or an elliptical shape in the plan view having a major axis of 4.0 mm or less, and wherein the concave portion has a shape similar to the shape of the piezoelectric element in the plan view so that an overlapping width in the plan view of the peripheral region of the piezoelectric element and the supporting plate is 0.05 mm-0.1 mm.

3. The ultrasonic transducer according to claim 2, wherein the concave portion has a depth of 0.05 mm-0.15 mm.

4. The ultrasonic transducer according to claim 1, wherein at least a part of the supporting plate in a thickness direction where the plurality of waveguides are formed is formed of ceramics.

5. The ultrasonic transducer according to claim 1, wherein the supporting plate includes a first plate body with a plurality of concave-portion-directed through-holes having opening widths same as those of the plurality of concave portions, respectively, and a second plate body with a plurality of waveguide-directed through-holes having opening widths same as those of the plurality of waveguides, respectively, and wherein the first and second plate bodies are fixed to each other in a state of being laminated in the thickness direction.

6. The ultrasonic transducer according to claims 5, wherein the second plate body is formed of ceramics.

7. The ultrasonic transducer according to claim 1, wherein the waveguide has a tubular part including the first end portion opened to the bottom surface of the concave portion, and a horn part including the second end portion opened to the second surface of the supporting plate, wherein the tubular part has an opening width that is smaller than that of the concave portion and that is constant over the thickness direction, and wherein the horn part has an opening width that is increased as the opening width comes close to the sound wave radiation opening opened to the second surface of the supporting plate from a proximal end side connected to the tubular part.

8. The ultrasonic transducer according to claim 7, wherein a ratio of the opening width of the tubular part with respect to a wavelength of a sound wave emitted by the vibrating body is within a range of 0.15-0.2.

9. The ultrasonic transducer according to claim 7, wherein a ratio of a length of the tubular part with respect to a wavelength of a sound wave emitted by the vibrating body is less than or equal to 0.09.

10. The ultrasonic transducer according to claim 7, wherein a ratio of a length of the tubular part with respect to a wavelength of a sound wave emitted by the vibrating body is less than or equal to 0.035.

11. The ultrasonic transducer according to claim 1, wherein a ratio of an opening width of the sound wave radiation opening with respect to an arrangement pitch of the plurality of piezoelectric elements is within a range of 0.8-0.95.

12. The ultrasonic transducer according to claim 1, further comprising:

a lower sealing plate that includes a plurality of piezoelectric-element-directed openings having sizes surrounding the plurality of piezoelectric elements and that is thicker than the piezoelectric element, the lower sealing plate being fixed to the flexible resin film so that the plurality of piezoelectric elements are positioned within the plurality of piezoelectric-element-directed openings in the plan view, respectively; and a wiring assembly fixed to the lower sealing plate, wherein the wiring assembly includes an insulating base layer, a conductive layer including first and second wirings that are arranged on the base layer and that are electrically connected to a pair of first and second application electrodes, respectively, of the piezoelectric element, and an insulative cover layer that covers the conductive layer, and wherein the base layer is provided with a first wiring/piezoelectric element connection opening for electrically connecting the first wiring to the first electrode of the corresponding piezoelectric element and a second wiring/piezoelectric element connection opening for electrically connecting the second wiring to the second electrode of the corresponding piezoelectric element.

13. The ultrasonic transducer according to claim 12, further comprising an upper sealing plate fixed to the lower sealing plate and the wiring assembly via a flexible resin, wherein the upper sealing plate is provided with opening parts at positions corresponding to the plurality of piezoelectric elements.

14. The ultrasonic transducer according to claim 13, further comprising a sound absorbing material fixed to the upper sealing plate so as to cover the plurality of opening parts of the upper sealing plate.

15. The ultrasonic transducer according to claim 14, further comprising a reinforcing plate fixed to the sound absorbing material.

16. A manufacturing method of an ultrasonic transducer that includes; a supporting plate provided with a plurality of concave portions that are opened to a first surface on one side in a thickness direction, and a plurality of waveguides having first end portions on one side that are respectively opened to bottom surfaces of the plurality of concave portions and that have opening widths smaller than those of the plurality of concave portions and second end portions on another side that are opened to a second surface on another side in the thickness direction to form sound wave radiation openings; a flexible resin film that is fixed to the first surface of the supporting plate so as to cover the plurality of concave portions; and the same number of piezoelectric elements as the plurality of concave portions that are fixed to a first surface of the flexible resin film so that their center regions overlap, in a plan view, with the corresponding plurality of concave portions and their peripheral regions overlap, in a plan view, with the first surface of the supporting plate, wherein a vibrating body formed by the piezoelectric element and the flexible resin film has a resonance frequency of the lowest flexural vibration mode higher than a driving frequency of the piezoelectric element, and wherein the supporting plate is configured so that a resonance frequency of the lowest flexural vibration mode of the entire of the ultrasonic transducer is higher than the driving frequency of the piezoelectric element, the method comprising:

a supporting plate forming step of forming the supporting plate;

a flexible resin film fixing step of fixing the flexible resin film to the supporting plate by an adhesive or thermocompression bonding to cover the plurality of concave portions;

a piezoelectric element fixing step of fixing the plurality of piezoelectric elements to the flexible resin film by an insulative adhesive in such a manner that the center regions overlap in the plan view with the corresponding plurality of concave portions and the peripheral regions overlap in the plan view with the supporting plate;

a lower sealing plate arranging step of preparing a lower sealing plate that has a plurality of piezoelectric-element-directed openings having sizes surrounding the plurality of piezoelectric elements, respectively, and that is thicker than the piezoelectric element, and then fixing the lower sealing plate to the flexible resin film by an adhesive so that the plurality of piezoelectric elements are arranged within the plurality of piezoelectric-element-directed openings in the plan view;

a wiring assembly preparation step of preparing a wiring assembly that includes an insulating base layer, a conductor layer including first and second wirings that are arranged on the base layer and that are electrically connected to a pair of first and second application electrodes, respectively, of the piezoelectric element, and an insulative cover layer enclosing the conductive layer, the base layer being provided with first and second wiring/piezoelectric element connection openings that respectively expose parts of the first and second wirings;

a wiring assembly fixing step of fixing the base layer to the lower sealing plate by an adhesive; and an electric connection step of electrically connecting the portion of the first wiring that is exposed through the first wiring/piezoelectric element connection opening and the portion of the second wiring that is exposed through the second wiring/piezoelectric element connection opening to the first and second electrodes of the piezoelectric element, respectively.

17. The manufacturing method according to claim 16, wherein the supporting plate forming step includes:

a process of preparing a concave-portion-directed plate that has a thickness same as a depth of the plurality of concave portions and that is provided with a plurality of through holes having opening widths same as those of the plurality of concave portions, a process of preparing a waveguide-directed plate that has a thickness same as a length of the plurality of waveguides and that is provided with a plurality of through holes having opening widths same as those of the waveguides, and a plate fixing process of fixing the concave-portion-directed plate and the waveguide-directed plate to each other by adhesive.

18. The manufacturing method according to claim 17, wherein the process of preparing the waveguide-directed plate is configured to inject ceramics material into a waveguide-plate-directed die that has a model depth same as the length of the plurality of waveguides and that is provided with a structure for forming a plurality of through holes having opening widths same as the opening widths of the plurality of the waveguides, respectively, and then bake the ceramics material.

19. The manufacturing method according to claim 17, wherein the process of preparing the concave-portion-directed plate is configured to inject ceramics material into a concave-portion-directed die that has a model depth same as the length of the plurality of concave portions and that is provided with a structure for forming a plurality of through holes having opening widths same as those of the plurality of the concave portions, respectively, and then bake the ceramics material.

20. The manufacturing method according to claim 17, wherein the process of preparing the concave-portion-directed plate is configured to prepare a metal plate having a thickness same as a depth of the plurality of concave portions, and then etch the metal plate so as to form a plurality of through holes having opening widths same as those of the plurality of concave portions, respectively.

* * * * *